United States Patent
Shimura et al.

(10) Patent No.: US 10,262,703 B2
(45) Date of Patent: Apr. 16, 2019

(54) SEMICONDUCTOR MEMORY DEVICE

(71) Applicant: Toshiba Memory Corporation, Minato-ku (JP)

(72) Inventors: Yasuhiro Shimura, Yokohama (JP); Keita Kimura, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/701,487

(22) Filed: Sep. 12, 2017

(65) Prior Publication Data
US 2018/0261267 A1 Sep. 13, 2018

(30) Foreign Application Priority Data
Mar. 8, 2017 (JP) ................. 2017-043707

(51) Int. Cl.
| *G11C 7/00* | (2006.01) |
| *G11C 7/10* | (2006.01) |
| *G11C 7/22* | (2006.01) |
| *G11C 5/06* | (2006.01) |

(52) U.S. Cl.
CPC ............. *G11C 7/1051* (2013.01); *G11C 7/22* (2013.01); *G11C 5/063* (2013.01)

(58) Field of Classification Search
CPC .............................. G11C 7/1051; G11C 5/063
See application file for complete search history.

(56) References Cited

U.S. PATENT DOCUMENTS

| 2012/0120732 | A1* | 5/2012 | Lee | G11C 8/10 365/185.22 |
| 2012/0250414 | A1* | 10/2012 | Khandelwal | G11C 16/26 365/185.17 |
| 2015/0071008 | A1* | 3/2015 | Yang | G11C 16/26 365/185.23 |
| 2016/0019971 | A1* | 1/2016 | Horii | G11C 16/26 365/185.17 |
| 2016/0267990 | A1 | 9/2016 | Bushnaq et al. | |

FOREIGN PATENT DOCUMENTS

JP 2016-170835 9/2016

* cited by examiner

*Primary Examiner* — Uyen B Tran
(74) *Attorney, Agent, or Firm* — Oblon, McClelland, Maier & Neustadt, L.L.P.

(57) ABSTRACT

According to one embodiment, a semiconductor memory device includes a first memory cell, a second memory cell, a first word line electrically coupled to the first memory cell, a second word line electrically coupled to the second memory cell, and a control circuit configured to supply voltages to the first word line and the second word line. In a read, the control circuit applies a first voltage to the first word line and a second voltage to the second word line, applies, after applying the first voltage to the first word line and the second voltage to the second word line, a third voltage lower than the first voltage and the second voltage to the second word line, and applies, after applying the third voltage to the second word line, the third voltage to the first word line.

6 Claims, 34 Drawing Sheets

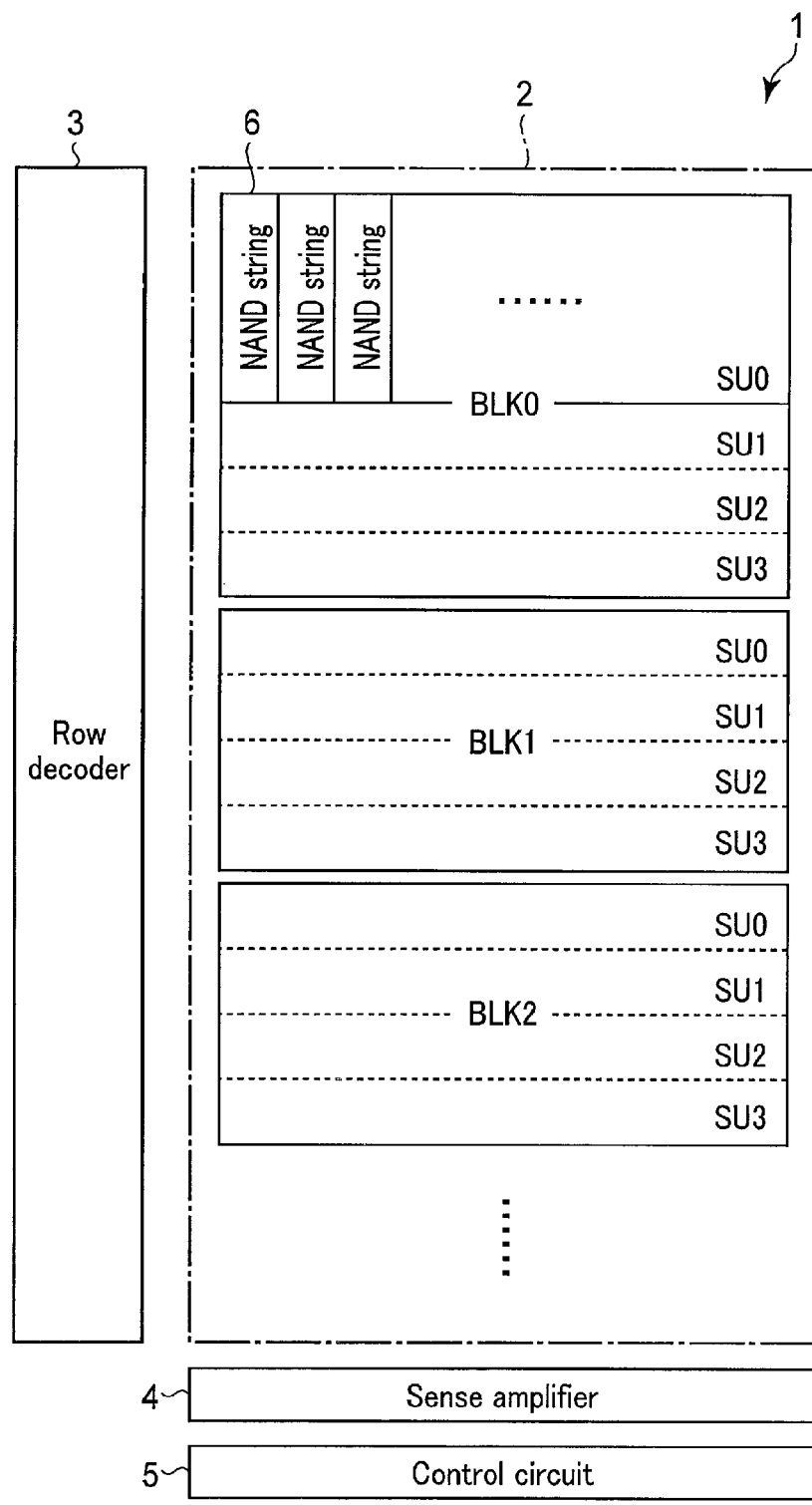
F I G. 1

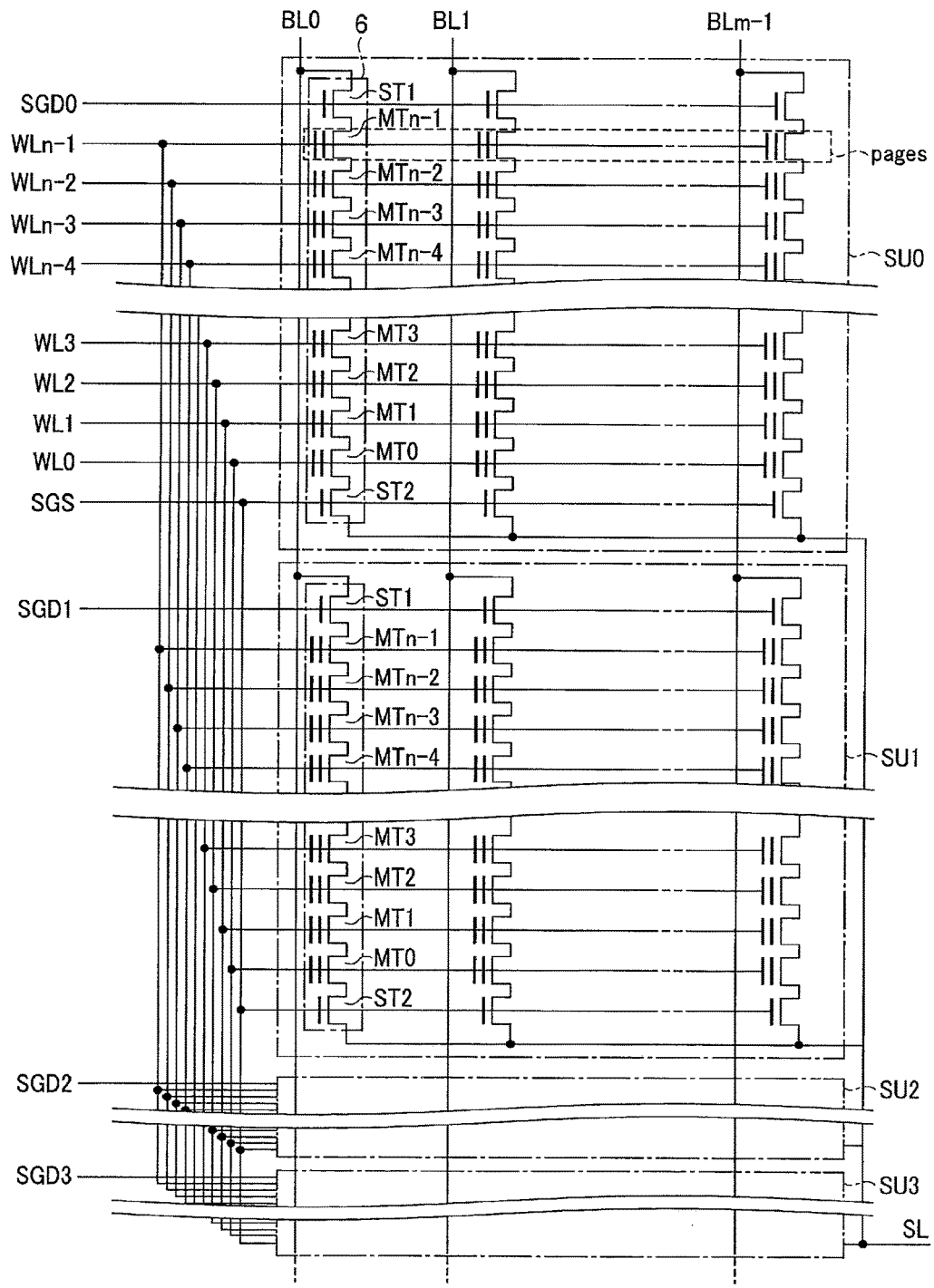
F I G. 2

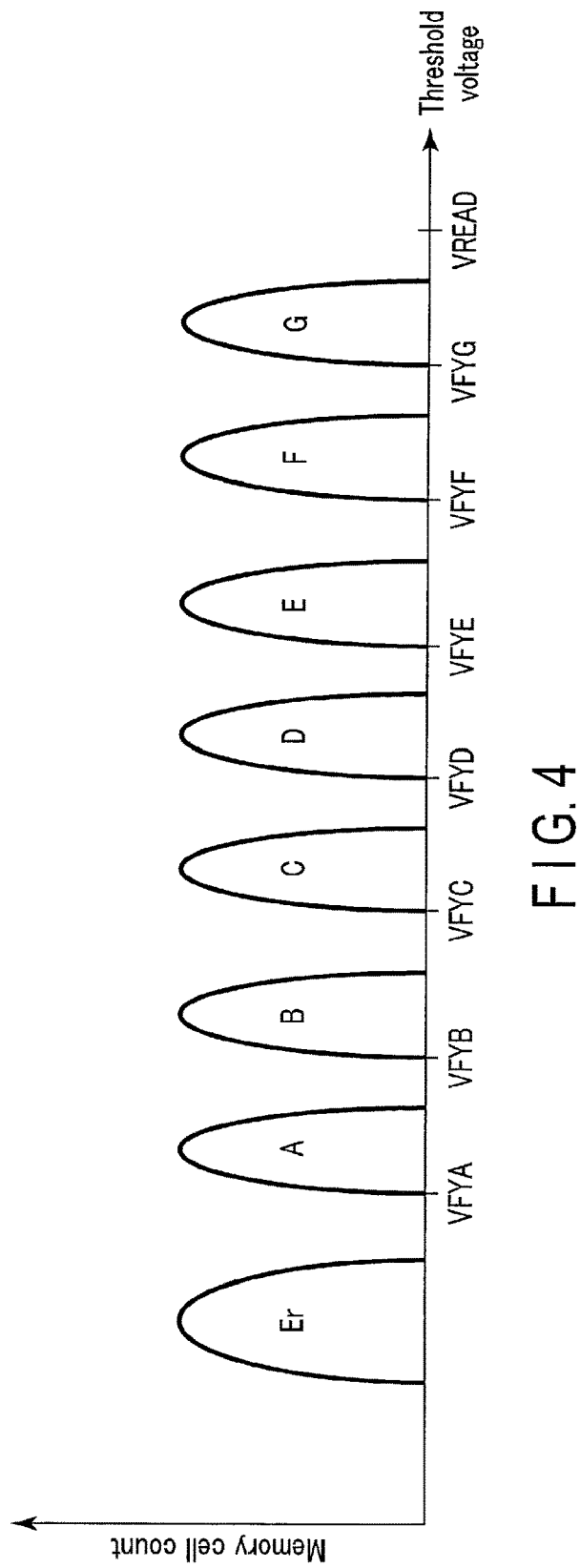
F I G. 4

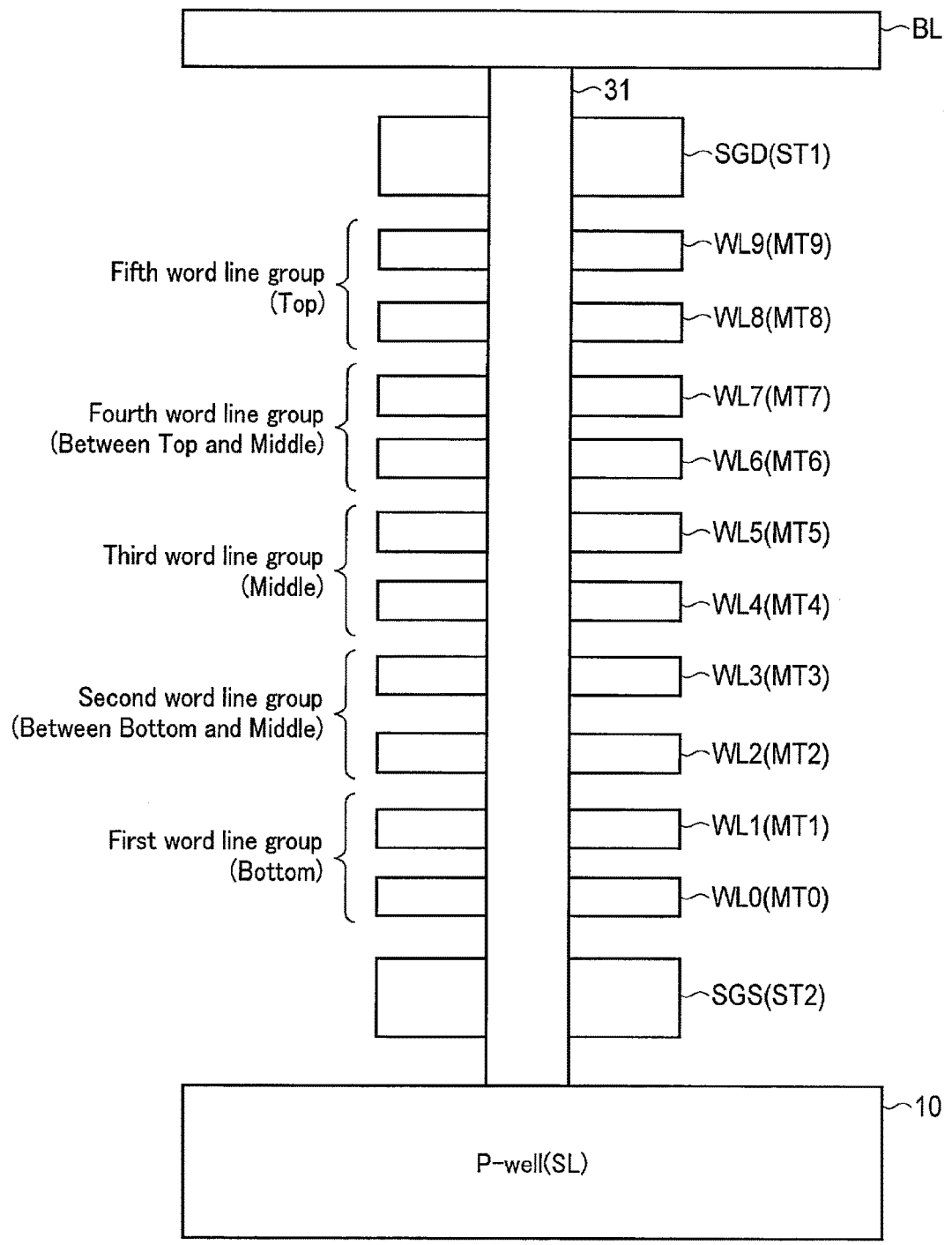
F I G. 5

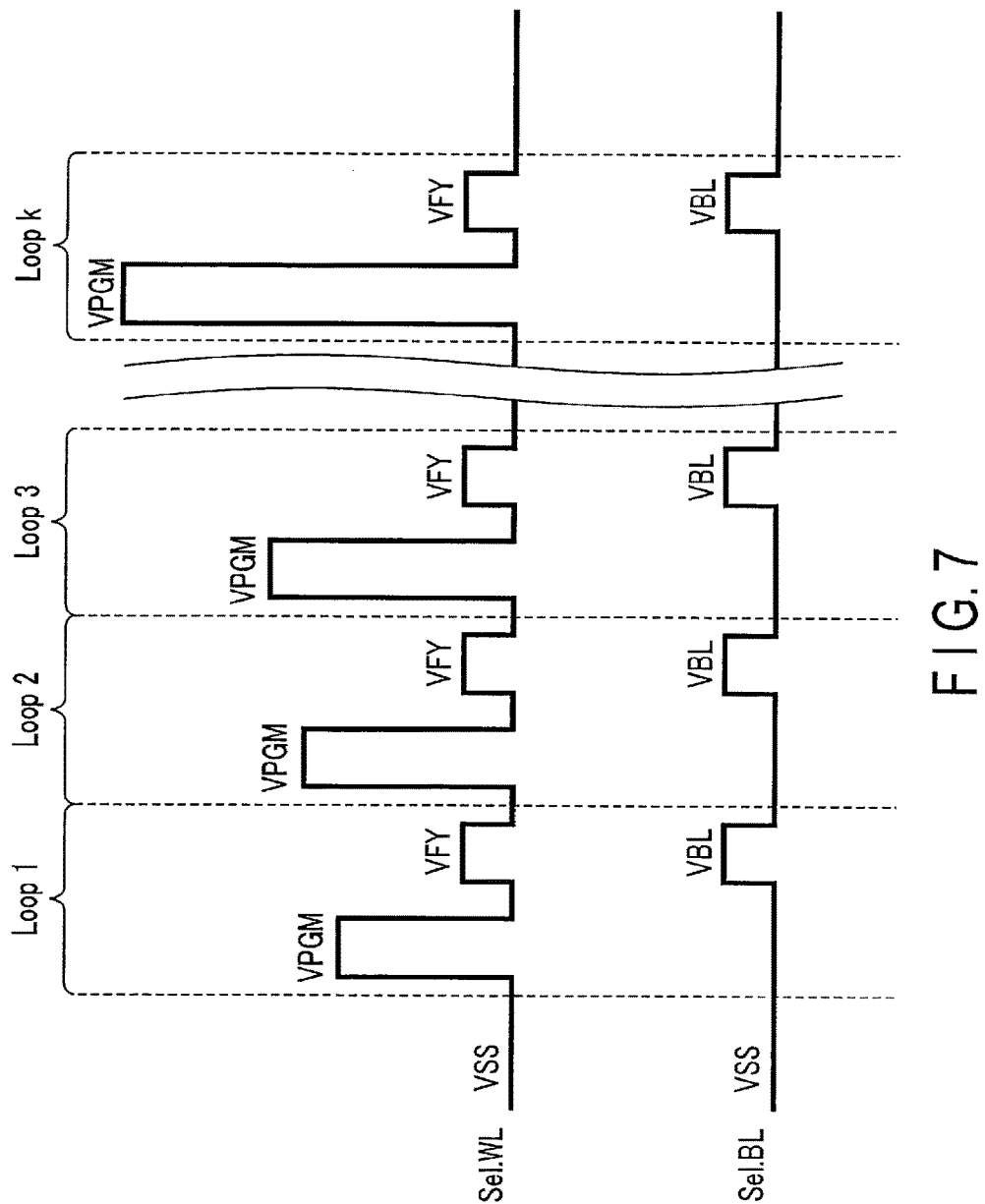
F I G. 7

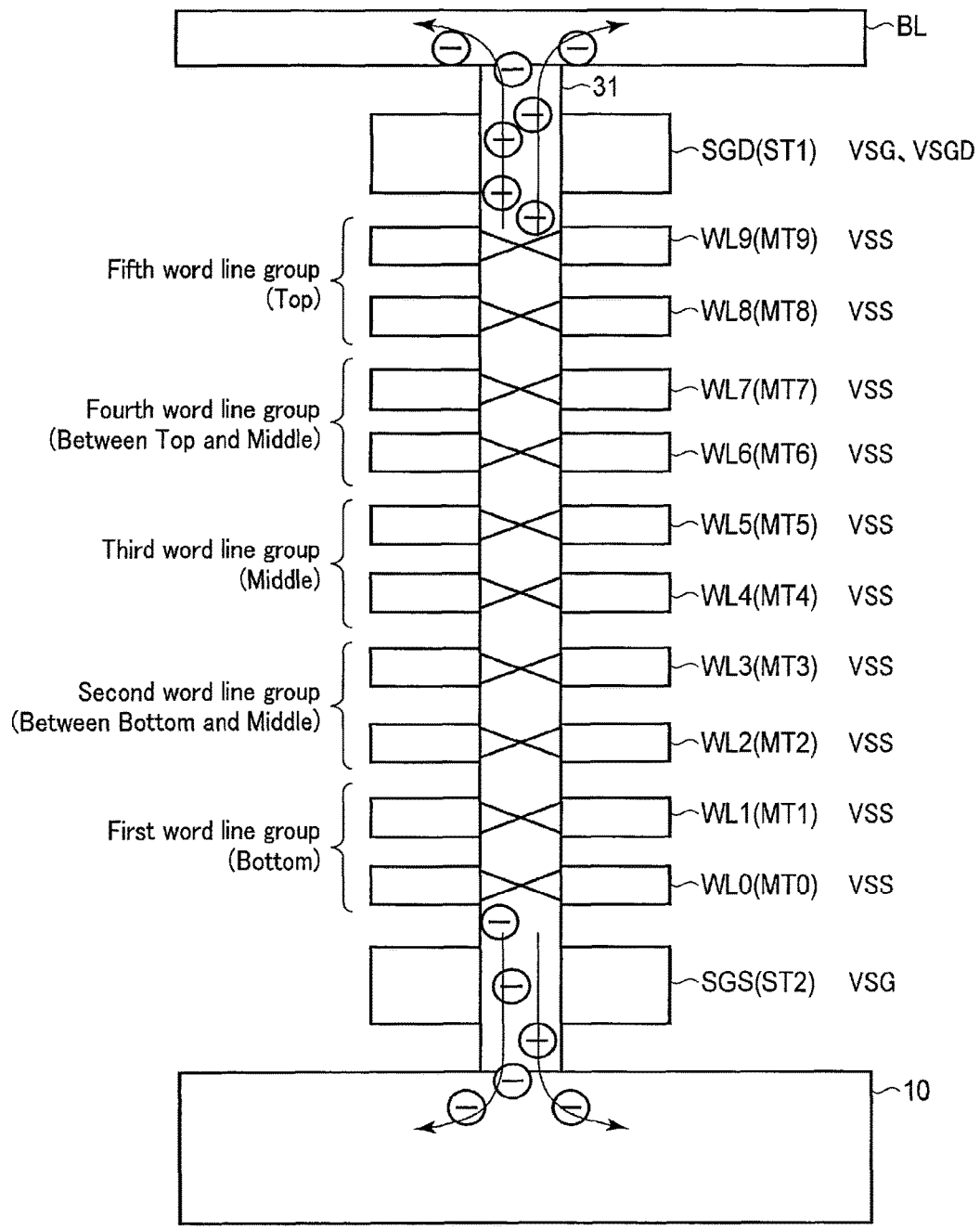
F I G. 16

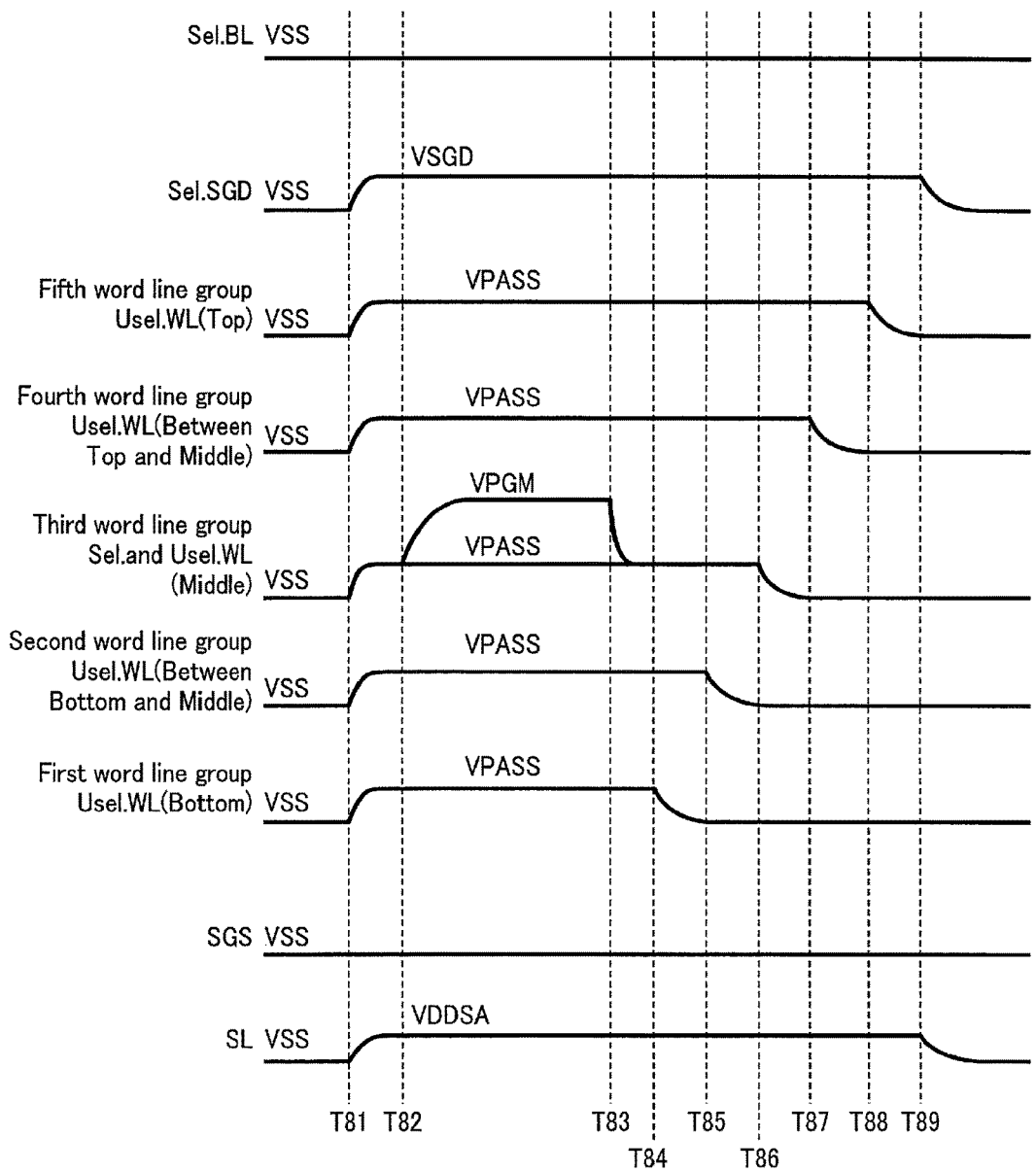
F I G. 20

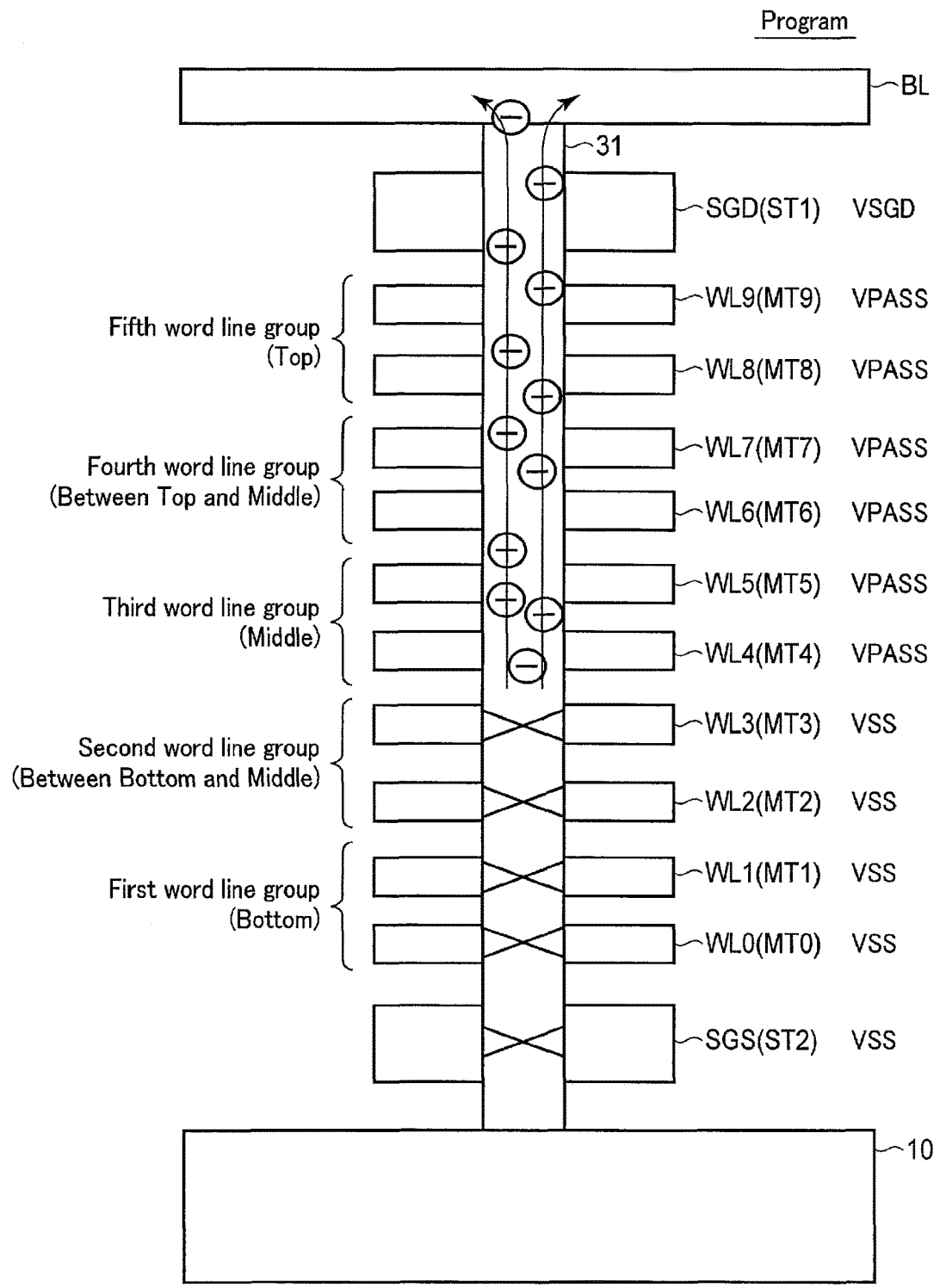
F I G. 22

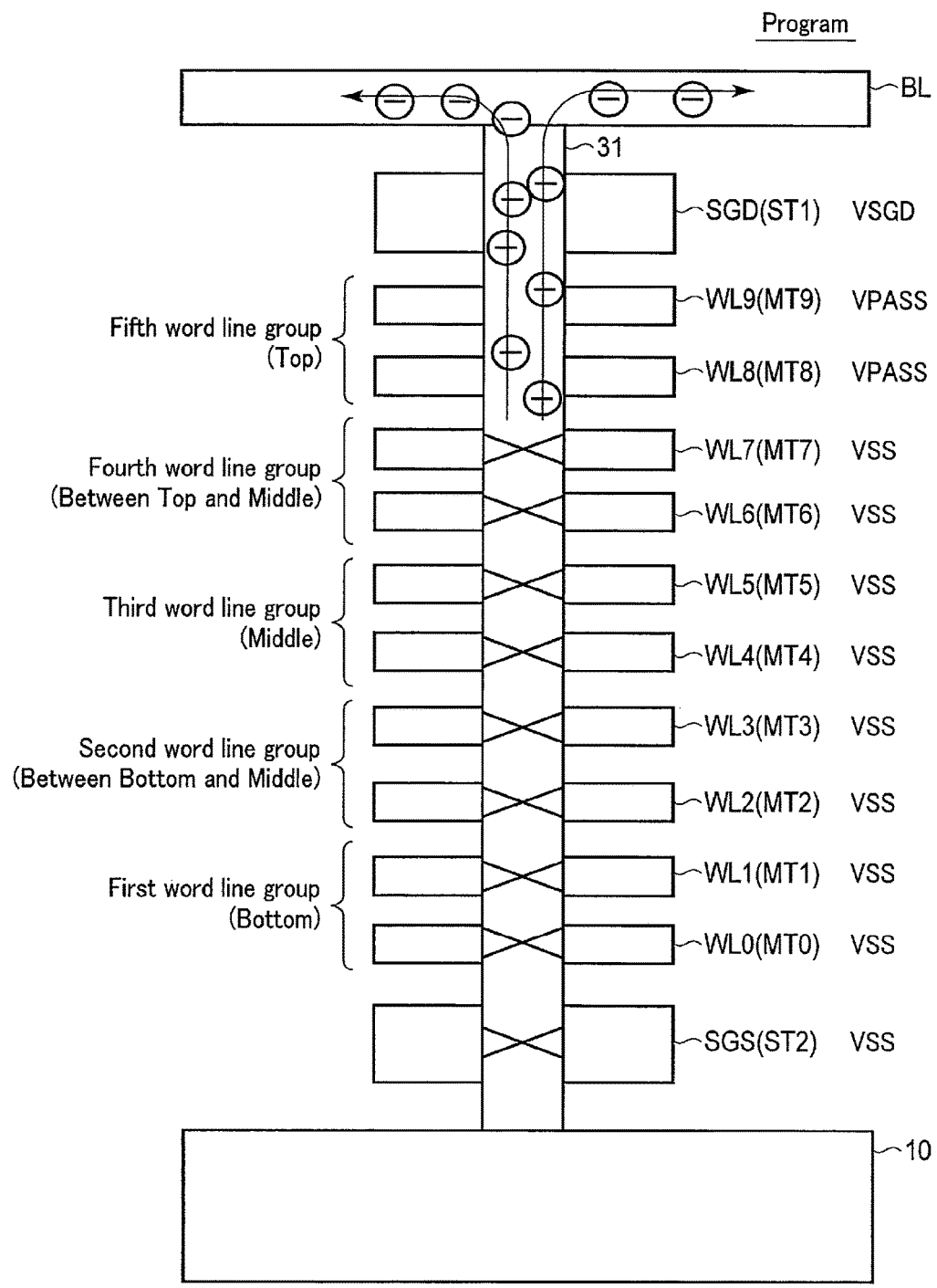
F I G. 24

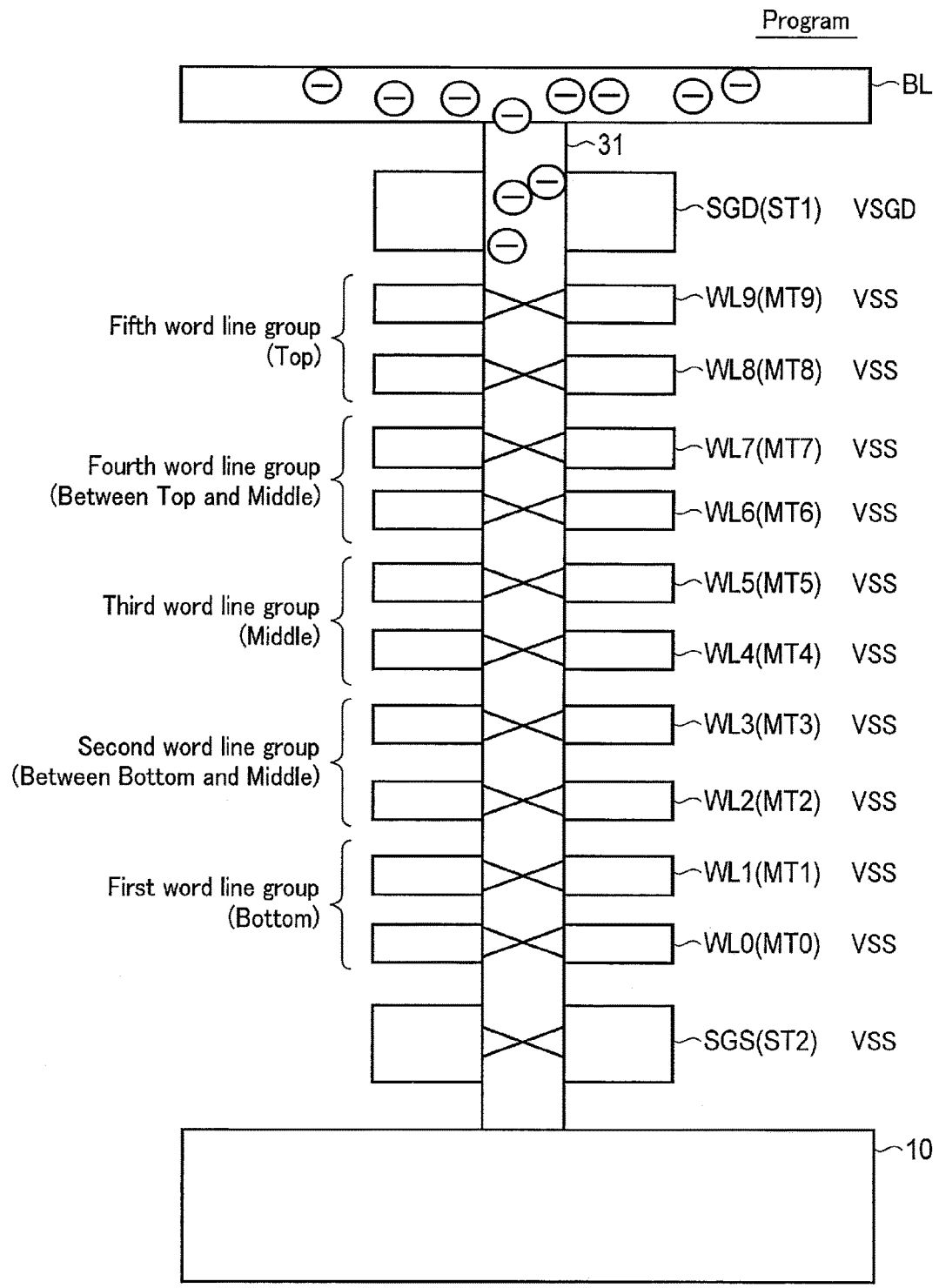
F I G. 25

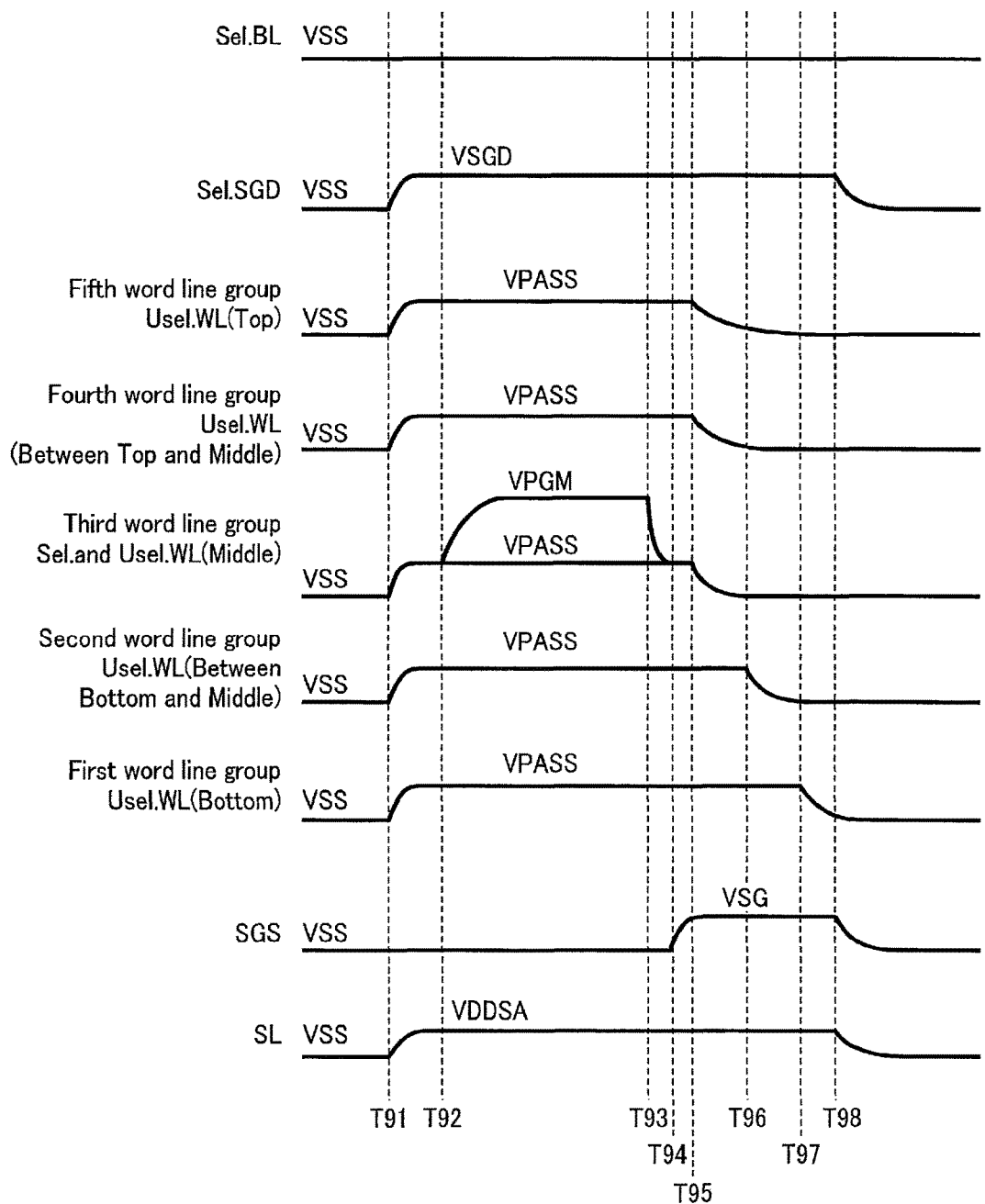
F I G. 26

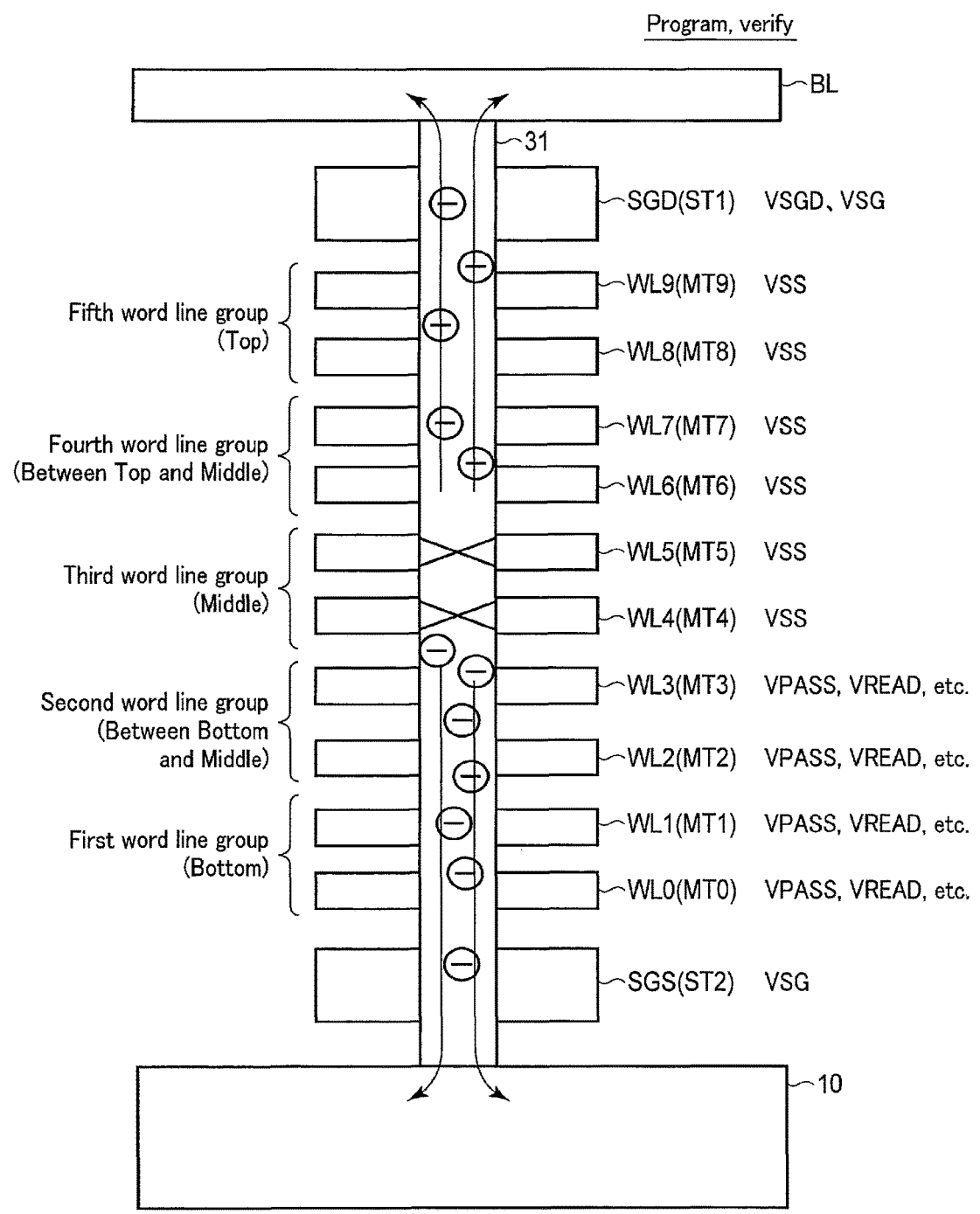
F I G. 28

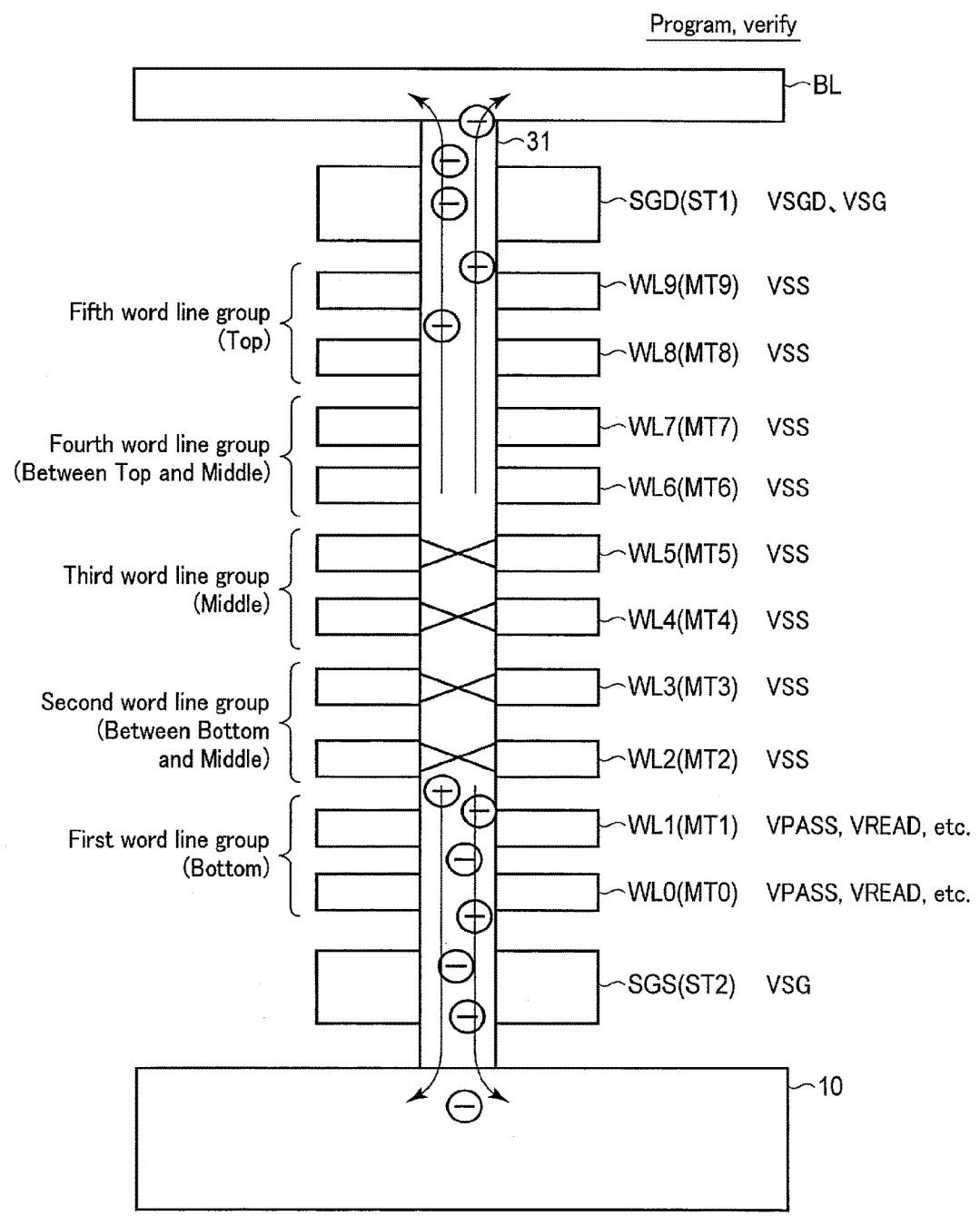
F I G. 29

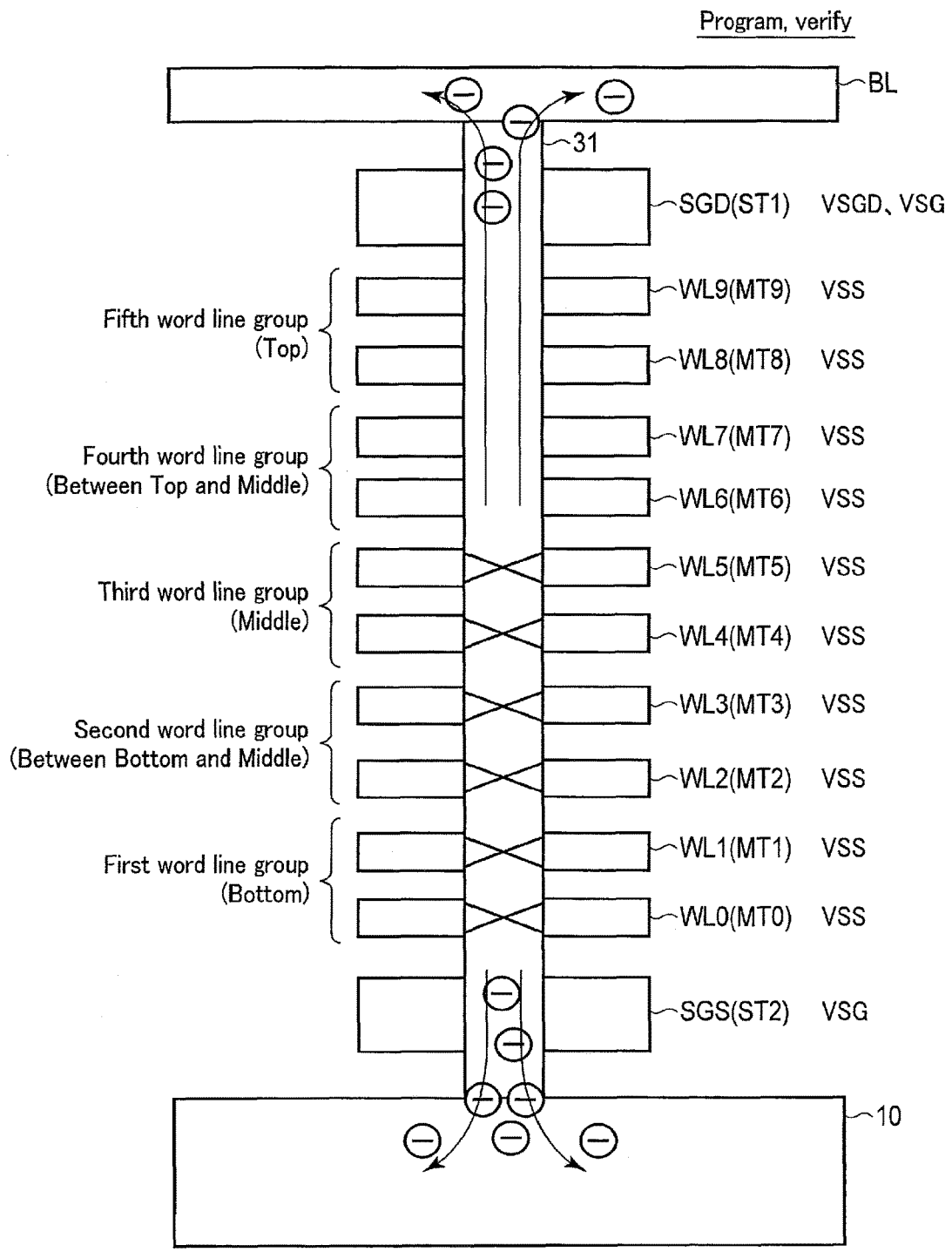
F I G. 30

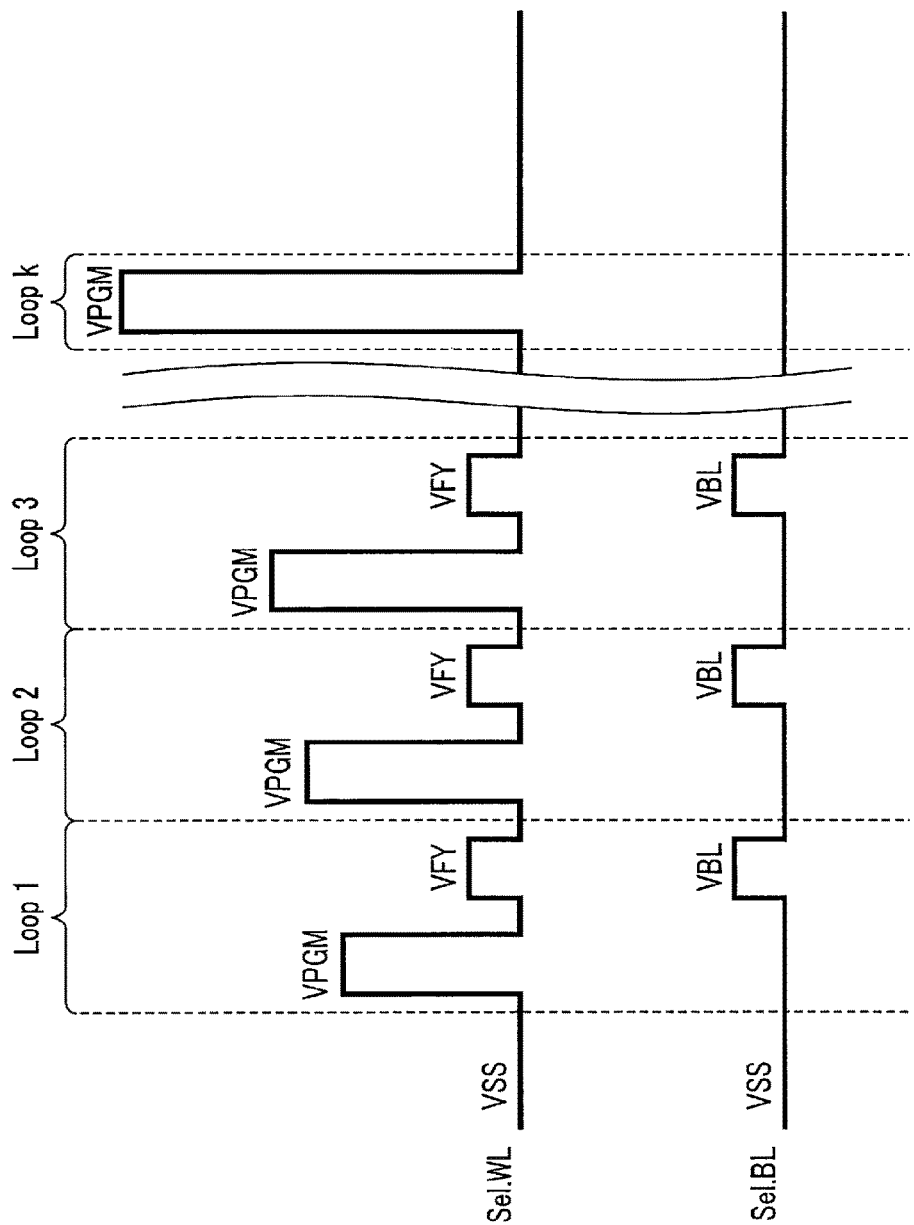
F I G. 31

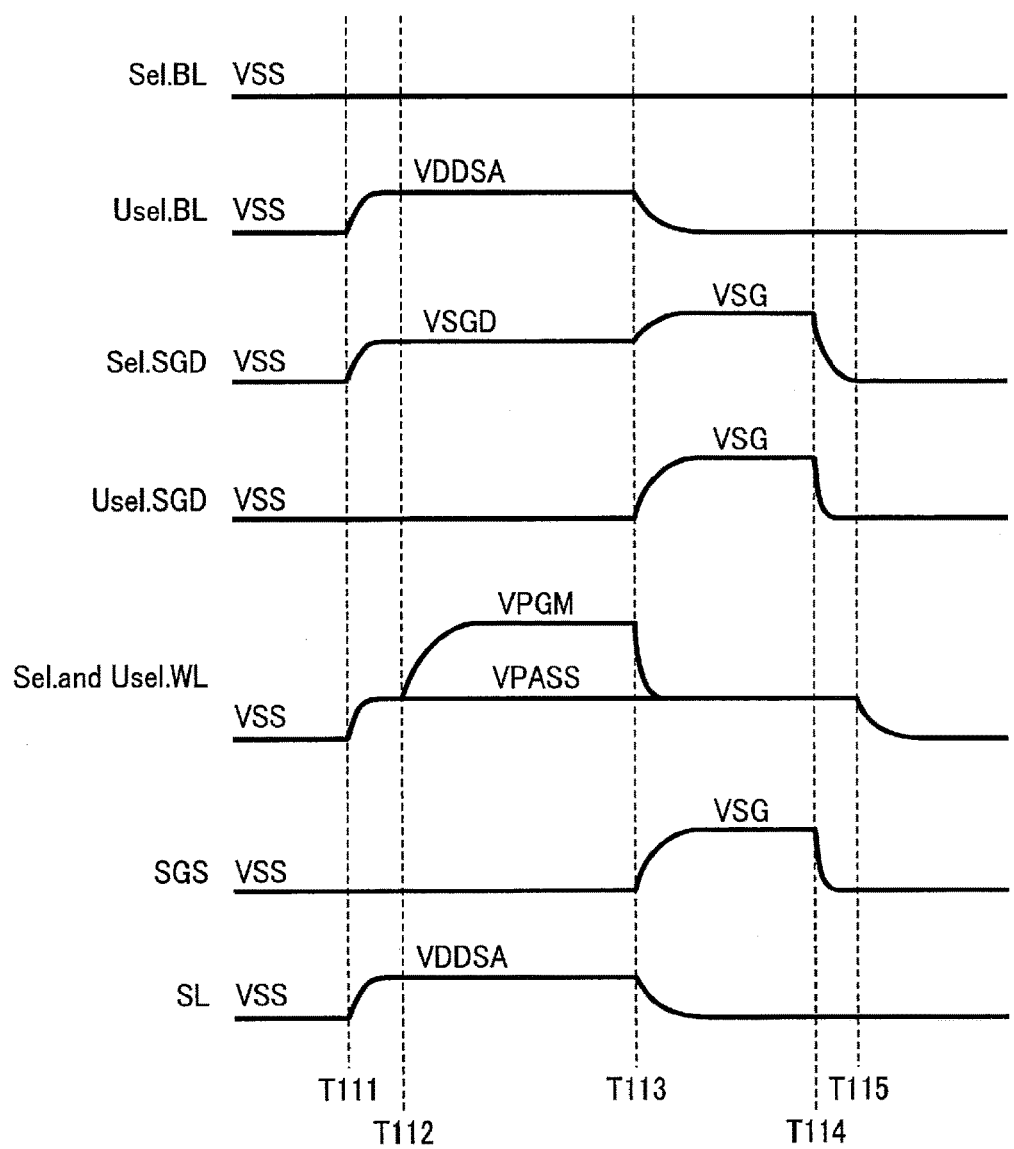
F I G. 32

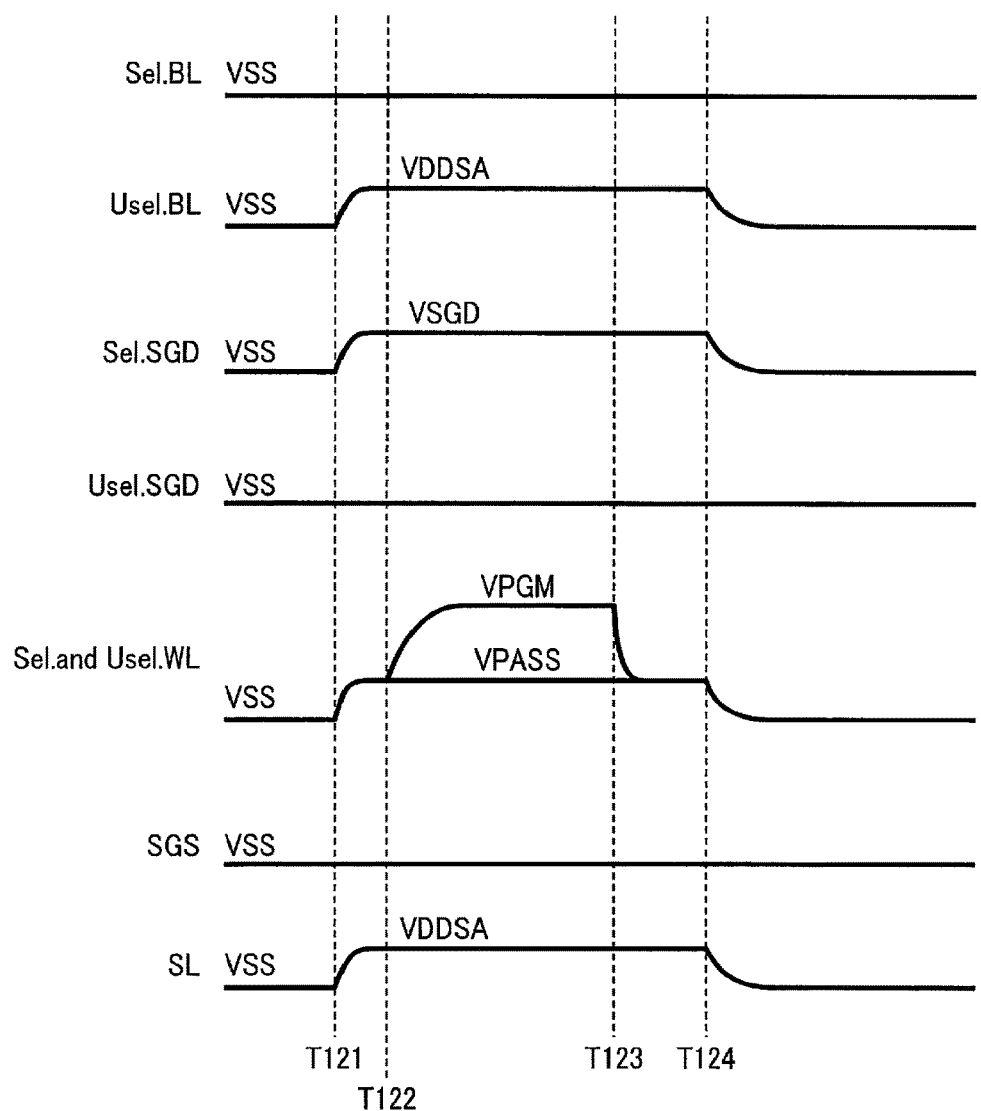
F I G. 33

SEMICONDUCTOR MEMORY DEVICE

CROSS-REFERENCE TO RELATED APPLICATIONS

This application is based upon and claims the benefit of priority from the prior Japanese Patent Application No. 2017-043707, filed Mar. 8, 2017, the entire contents of which are incorporated herein by reference.

FIELD

Embodiments described herein relate generally to a semiconductor memory device.

BACKGROUND

There is known a NAND flash memory in which memory cells are three-dimensionally arrayed.

BRIEF DESCRIPTION OF THE DRAWINGS

FIG. 1 is a block diagram showing a semiconductor memory device according to the first embodiment;

FIG. 2 is a circuit diagram showing a block in the semiconductor memory device according to the first embodiment;

FIG. 4 is a graph showing the threshold distributions of each memory cell transistor in the semiconductor memory device according to the first embodiment;

FIG. 5 is a simplified sectional view showing a NAND string in the semiconductor memory device according to the first embodiment;

FIG. 7 is a timing chart showing the voltages of a word line and bit line at the time of a write in the semiconductor memory device according to the first embodiment;

FIGS. 14, 15, and 16 are sectional views each showing the NAND string at the time of the read, program, and verify in the semiconductor memory device according to the first embodiment;

FIG. 20 is a timing chart showing various voltages at the time of a program in a semiconductor memory device according to the third embodiment;

FIGS. 21, 22, 23, 24, and 25 are sectional views each showing a NAND string at the time of the program in the semiconductor memory device according to the third embodiment;

FIG. 26 is a timing chart showing various voltages at the time of a program in a semiconductor memory device according to the fourth embodiment;

FIGS. 28, 29, and 30 are sectional views each showing a NAND string at the time of the program and the verify in the semiconductor memory device according to the fourth embodiment;

FIG. 31 is a timing chart showing the voltages of a word line and bit line at the time of a write in a semiconductor memory device according to the fifth embodiment;

FIG. 32 is a timing chart showing various voltages at the time of a program in the semiconductor memory device according to the fifth embodiment;

FIG. 33 is a timing chart showing various voltages at the time of a program in a semiconductor memory device according to a comparative example;

DETAILED DESCRIPTION

Figure 3:
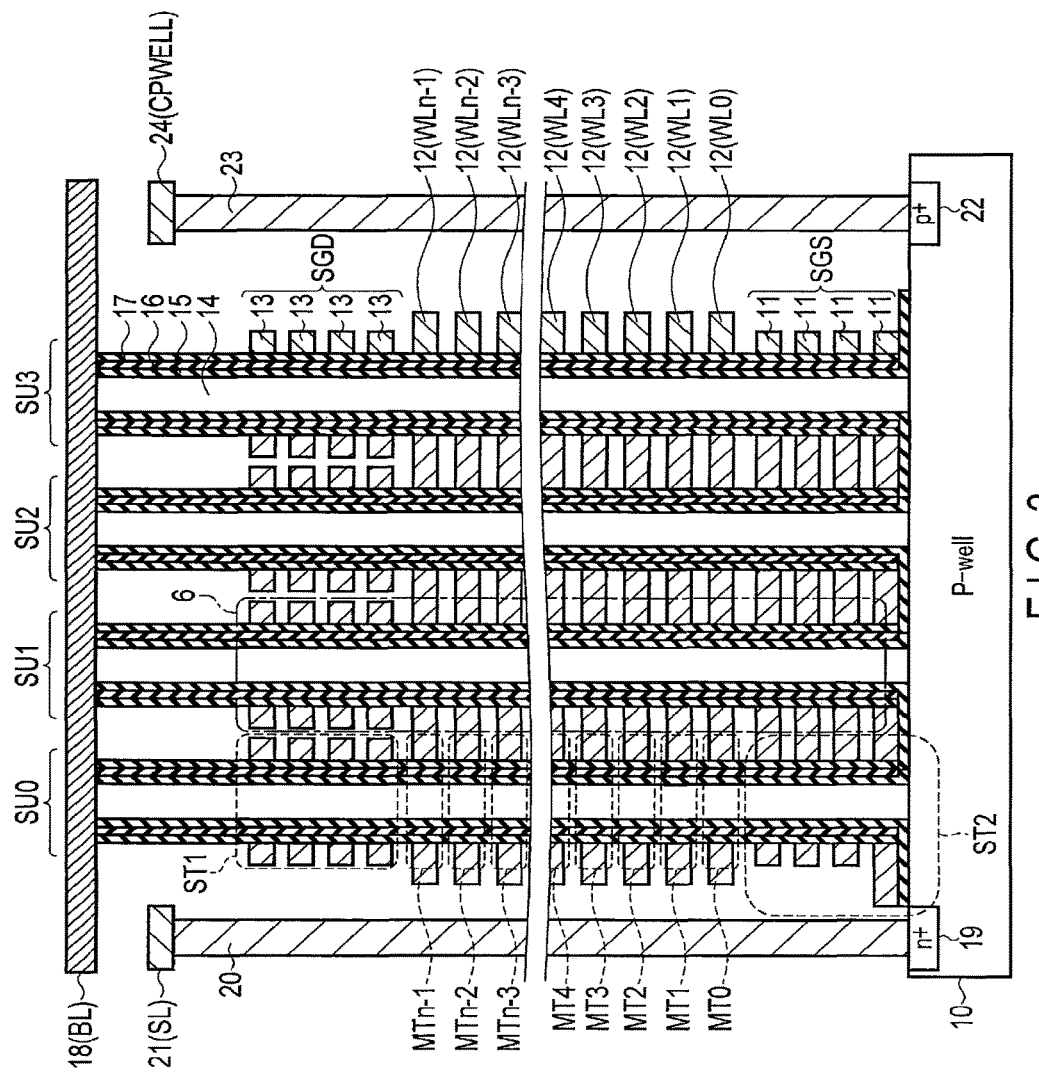
FIG. 3 is a sectional view showing the block in the semiconductor memory device according to the first embodiment.

In general, according to one embodiment, a semiconductor memory device includes a first memory cell, a second memory cell, a first word line electrically coupled to the first memory cell, a second word line electrically coupled to the second memory cell, and a control circuit configured to supply voltages to the first word line and the second word line. In a read, the control circuit applies a first voltage to the first word line and a second voltage to the second word line, applies, after applying the first voltage to the first word line and the second voltage to the second word line, a third voltage lower than the first voltage and the second voltage to the second word line, and applies, after applying the third voltage to the second word line, the third voltage to the first word line.

Embodiments will be described below with reference to the accompanying drawings. The same reference numerals denote the same parts in the drawings.

First Embodiment

A semiconductor memory device according to the first embodiment will be described below with reference to FIGS. 1, 2, 3, 4, 5, 6, 7, 8, 9, 10, 11, 12, 13, 14, 15, and 16. As the semiconductor memory device, a three-dimensional stacked NAND flash memory in which memory cells are three-dimensionally stacked on a semiconductor substrate will be explained below. In the following description, a term "couple" includes not only direct coupling but also coupling via an arbitrary element.

[Arrangement Example of First Embodiment]

FIG. 1 is a block diagram showing a semiconductor memory device 1 according to the first embodiment.

As shown in FIG. 1, the semiconductor memory device (NAND flash memory) 1 includes a memory cell array 2, a row decoder 3, a sense amplifier 4, and a control circuit 5.

The memory cell array 2 includes a plurality of blocks BLK (BLK0, BLK1, BLK2, . . . ) each including nonvolatile memory cell transistors associated with rows and columns. Each block BLK includes, for example, four string units SU (SU0 to SU3). Each string unit SU includes a plurality of NAND strings 6. The number of blocks in the memory cell array 2 and the number of string units in each block are arbitrary. The memory cell array 2 will be described in detail later.

The row decoder 3 decodes a row address, selects one of the blocks BLK based on a decoding result, and further selects one of the string units SU in the selected block. The row decoder 3 outputs a necessary voltage to the block BLK. The row address is given from, for example, a controller that controls the NAND flash memory 1.

The sense amplifier 4 senses data read from the memory cell array 2 at the time of data read. The sense amplifier 4 then outputs the read data to the controller. At the time of data write, the sense amplifier 4 transfers, to the memory cell array 2, write data received from the controller.

The control circuit 5 controls the overall operation of the NAND flash memory 1.

FIG. 2 is a circuit diagram showing the block BLK in the semiconductor memory device 1 according to the first embodiment.

As describe above, the block BLK includes, for example, the four string units SU, and each string unit SU includes the plurality of NAND strings 6.

As shown in FIG. 2, each NAND string 6 includes n memory cell transistors MT (MT0 to MTn−1) and select transistors ST1 and ST2. Each memory cell transistor MT includes a control gate and a charge storage layer, and nonvolatilely holds data. The memory cell transistors MT are series-coupled between the first terminal of the select transistor ST1 and the first terminal of the select transistor ST2.

The control terminals of the select transistors ST1 in the string units SU0 to SU3 are coupled to select gate lines SGD0 to SGD3, respectively. On the other hand, the control terminals of the select transistors ST2 in the string units SU0 to SU3 are commonly coupled to, for example, a select gate line SGS but may be coupled to different select gate lines SGS0 to SGS3 on a string unit basis. Furthermore, the control terminals of the memory cell transistors MT0 to MTn−1 in the same block BLK are commonly coupled to word lines WL0 to WLn−1, respectively.

In addition, the second terminals of the select transistors ST1 of the NAND strings 6 on the same column in the memory cell array 2 are commonly coupled to one of bit lines BL (BL0 to BLm−1). That is, each bit line BL commonly couples the NAND strings 6 among the plurality of blocks BLK. Furthermore, the second terminals of the plurality of select transistors ST2 are commonly coupled to a source line SL.

That is, the string unit SU is an aggregate of NAND strings 6 coupled to different bit lines BL and coupled to the same select gate line SGD. The block BLK is an aggregate of the plurality of string units SU that share the word lines WL. The memory cell array 2 is an aggregate of the plurality of blocks BLK that share the bit lines BL.

Data are collectively written or read in or from the memory cell transistor MT coupled to one of the word lines WL in the string unit SU. This unit will be referred to as a page hereinafter. Data erase can be done for each block BLK or a unit smaller than the block BLK.

FIG. 3 is a sectional view showing the block BLK in the semiconductor memory device 1 according to the first embodiment.

As shown in FIG. 3, the plurality of NAND strings 6 are provided on a p-type well region (semiconductor substrate) 10. That is, for example, four interconnection layers 11 functioning as the select gate lines SGS, n interconnection layers 12 functioning as the word lines WL0 to WL7, and, for example, four interconnection layers 13 functioning as the select gate lines SGD are sequentially stacked on the well region 10. Insulating layers (not shown) are provided between the stacked interconnection layers.

Pillar shaped conductors 14 extending through the interconnection layers 13, 12, and 11 and reaching the well region 10 are provided. A gate insulating layer 15, a charge storage layer (an insulating layer or a conductive layer) 16, and a block insulating layer 17 are sequentially provided on the side surface of each conductor 14. The memory cell transistors MT and the select transistors ST1 and ST2 are provided by the conductor 14, the gate insulating layer 15, the charge storage layer 16, and the block insulating layer 17. Each conductor 14 is a region that functions as the current path of the NAND string 6 and in which the channels of the transistors are provided. The upper ends of the conductors 14 are coupled to a metal interconnection layer 18 functioning as the bit lines BL.

An $n^+$-type impurity diffusion layer 19 is provided in the surface region of the well region 10. A contact plug 20 is provided on the diffusion layer 19. The contact plug 20 is coupled to a metal interconnection layer 21 functioning as the source line SL. In addition, a $p^{+-}$type impurity diffusion layer 22 is provided in the surface region of the well region 10. A contact plug 23 is provided on the diffusion layer 22. The contact plug 23 is coupled to a metal interconnection layer 24 functioning as a well interconnection CPWELL. The well interconnection CPWELL is an interconnection used to apply a potential to the conductors 14 via the well region 10.

A plurality of arrangements described above are arrayed in the depth direction of the sheet of FIG. 3. The string unit SU is formed by the aggregate of the plurality of NAND strings 6 arranged in the depth direction.

FIG. 4 is a graph showing the threshold distributions of each memory cell transistor MT in the semiconductor memory device 1 according to the first embodiment.

As shown in FIG. 4, the threshold voltage of each memory cell transistor MT takes a value included in one of eight discrete distributions. These eight distributions will be referred to as an Er level, A level, B level, C level, D level, E level, F level, and G level in ascending order of threshold.

The Er level corresponds to, for example, a data erase state. A threshold included in the Er level is lower than a voltage VFYA, and has a positive or negative value.

The A to G levels each correspond to a state in which charges are injected into the charge storage layer and data is written. A threshold included in each of the distributions of the A to G levels has, for example, a positive value. A threshold included in the A level ranges from the voltage VFYA (inclusive) to a voltage VFYB (exclusive) (VFYB>VFYA). A threshold included the B level ranges from the voltage VFYB (inclusive) to a voltage VFYC (exclusive) (VFYC>VFYB). A threshold included in the C level ranges from the voltage VFYC (inclusive) to a voltage VFYD (exclusive) (VFYD>VFYC). A threshold included in the D level ranges from the voltage VFYD (inclusive) to a voltage VFYE (exclusive) (VFYE>VFYD). A threshold included in the E level ranges from the voltage VFYE (inclusive) to a voltage VFYF (exclusive) (VFYF>VFYE). A threshold included in the F level ranges from the voltage VFYF (inclusive) to a voltage VFYG (exclusive) (VFYG>VFYF). A threshold included in the G level ranges from the voltage VFYG (inclusive) to a voltage VREAD (exclusive) (VREAD>VFYG). Note that VREAD is the voltage applied to the unselected word lines WL at the time of data read.

As described above, each memory cell transistor MT can take the eight kinds of states by having one of the eight threshold distributions. By assigning these states to 000 to 111 in a binary notation, each memory cell transistor MT can hold 3-bit data.

[Read Example of First Embodiment]

FIG. 5 is a simplified sectional view showing the NAND string 6 in the semiconductor memory device 1 according to the first embodiment. FIG. 5 shows the select gate lines SGS and SGD and the word lines WL0 to WL9 as the NAND string 6.

As shown in FIG. 5, in this example, the word lines WL0 to WL9 in the NAND string 6 are divided into the first to fifth word line groups from the lower side (bottom side). More specifically, the bottom first word line group includes the word lines WL0 and WL1. The second word line group between the bottom and middle word line groups includes the word lines WL2 and WL3. The middle third word line group includes the word lines WL4 and WL5. The fourth word line group between the top and middle word line groups includes the word lines WL6 and WL7. The top fifth word line group includes the word lines WL8 and WL9. As will be described later, the first to fifth word line groups are independently controlled.

In the following description, VSS<VSGD<VDD≈VCELSRC<VBL<VSGD_PROG≈VSG<VPASS≈VREAD<VPGM holds.

Figure 6:
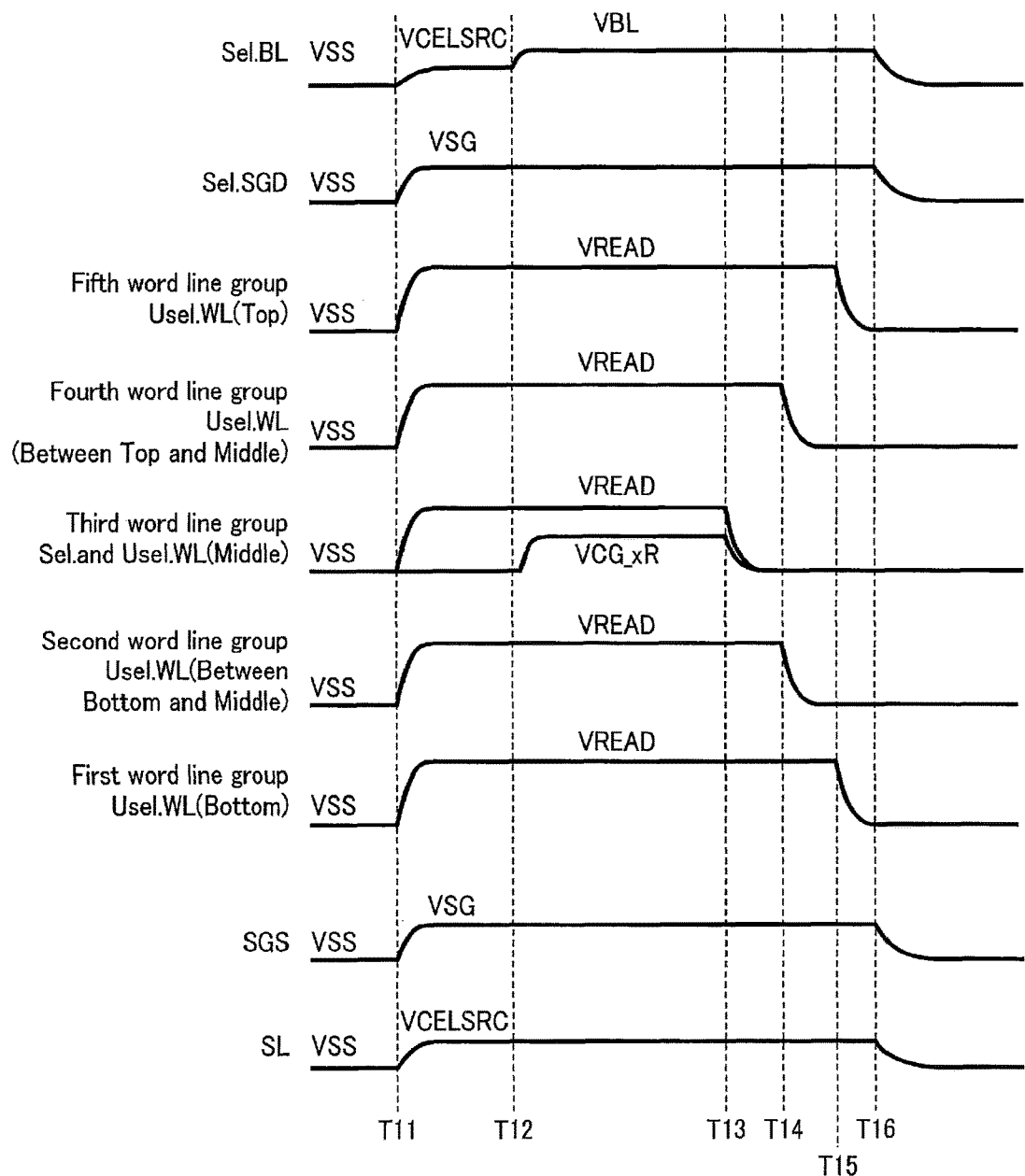
FIG. 6 is a timing chart showing various voltages at the time of a read in the semiconductor memory device according to the first embodiment.

FIG. 6 is a timing chart showing various voltages at the time of a read in the semiconductor memory device 1 according to the first embodiment. In this example, the NAND string 6 shown in FIG. 5 is selected and voltages supplied to the various control lines of FIG. 5 are shown. FIG. 6 shows an example in which the third word line group includes the selected word line WL.

As shown in FIG. 6, at time T11, the sense amplifier 4 raises the voltage of the selected bit line BL from the voltage VSS (for example, 0 V) to the voltage VCELSRC. The voltage of the source line SL rises from the voltage VSS to the voltage VCELSRC. Although not shown, the voltage VCELSRC is applied to the unselected bit lines BL. The row decoder 3 raises the voltages of the selected select gate line SGD and select gate line SGS from the voltage VSS to the voltage VSG. This turns on the select transistors ST1 and ST2.

At time T11, the row decoder 3 raises the voltages of the unselected word lines WL from the voltage VSS to the voltage VREAD. In this example, the voltage VREAD is applied to the unselected word lines WL of the first to fifth word line groups. The voltage VREAD is a voltage that turns on all the memory cell transistors MT regardless of the thresholds of the memory cell transistors MT. This turns on the memory cell transistors MT coupled to the unselected word lines.

Continuously, at time T12, the sense amplifier 4 raises the voltage of the selected bit line BL to the voltage VBL. After the selected bit line BL is charged to the voltage VBL, the row decoder 3 raises the voltage of the selected word line WL of the third word line group from the voltage VSS to a voltage VCG_xR. The voltage VCG_xR is at a read level corresponding to the threshold of the memory cell transistor MT, and satisfies VCG_xR<VREAD. This reads data in accordance with ON/OFF of the memory cell transistor MT coupled to the selected word line WL.

After data read, the voltages of the various control lines are lowered to the voltage VSS after time T13. At time T13, the row decoder 3 lowers the voltages of the word lines WL of the third word line group to the voltage VSS. At this time, both the voltages of the selected word line WL and unselected word line WL of the third word line group are lowered.

Next, at time T14, the row decoder 3 lowers the voltages of the word lines WL of the second and fourth word line groups to the voltage VSS. At time T15, the row decoder 3 lowers the voltages of the word lines WL of the first and fifth word line groups to the voltage VSS. After that, at time T16, the voltages of the bit line BL, source line SL, and select gate lines SGS and SGD are lowered to the voltage VSS.

That is, the voltages of the word lines WL of the third word line group, the word lines WL of the second and fourth word line groups, the word lines WL of the first and fifth word line groups, and the select gate lines SGS and SGD sequentially start to lower. This sequentially turns off the memory cell transistors MT of the middle word line group, the memory cell transistors MT between the bottom and middle word line groups and between the top and middle word line groups, the memory cell transistors MT of the bottom and top word line groups, and the select transistors ST1 and ST2.

[Write Example of First Embodiment]

FIG. 7 is a timing chart showing the voltages of the word line WL and bit line BL at the time of a write in the semiconductor memory device 1 according to the first embodiment.

As shown in FIG. 7, the write includes a program and a verify.

The program is an operation of raising the threshold by injecting electrons into the charge storage layer (or maintaining the threshold by prohibiting injection). The verify is an operation of determining whether the threshold of the memory cell transistor MT reaches the target level by read data after the program. In loops 1 to k, the combination of the program and verify is repeated, thereby raising the threshold of the memory cell transistor MT to the target level.

More specifically, in loop 1, the program is performed by applying the voltage VPGM to the selected word line WL. After that, the verify is performed by applying the voltage VFY to the selected word line WL. At this time, for example, the voltages VFYA, VFYB, VFYC, VFYD, VFYE, VFYF, and VFYG are sequentially applied. At the time of the verify, the voltage VBL is applied to the selected bit line BL. This completes loop 1. After that, in loops 2 to k, the step-up voltage VPGM is applied to the selected word line WL, and the same operations as in loop 1 are performed.

The program and the verify will be described in detail below.

Figure 8:
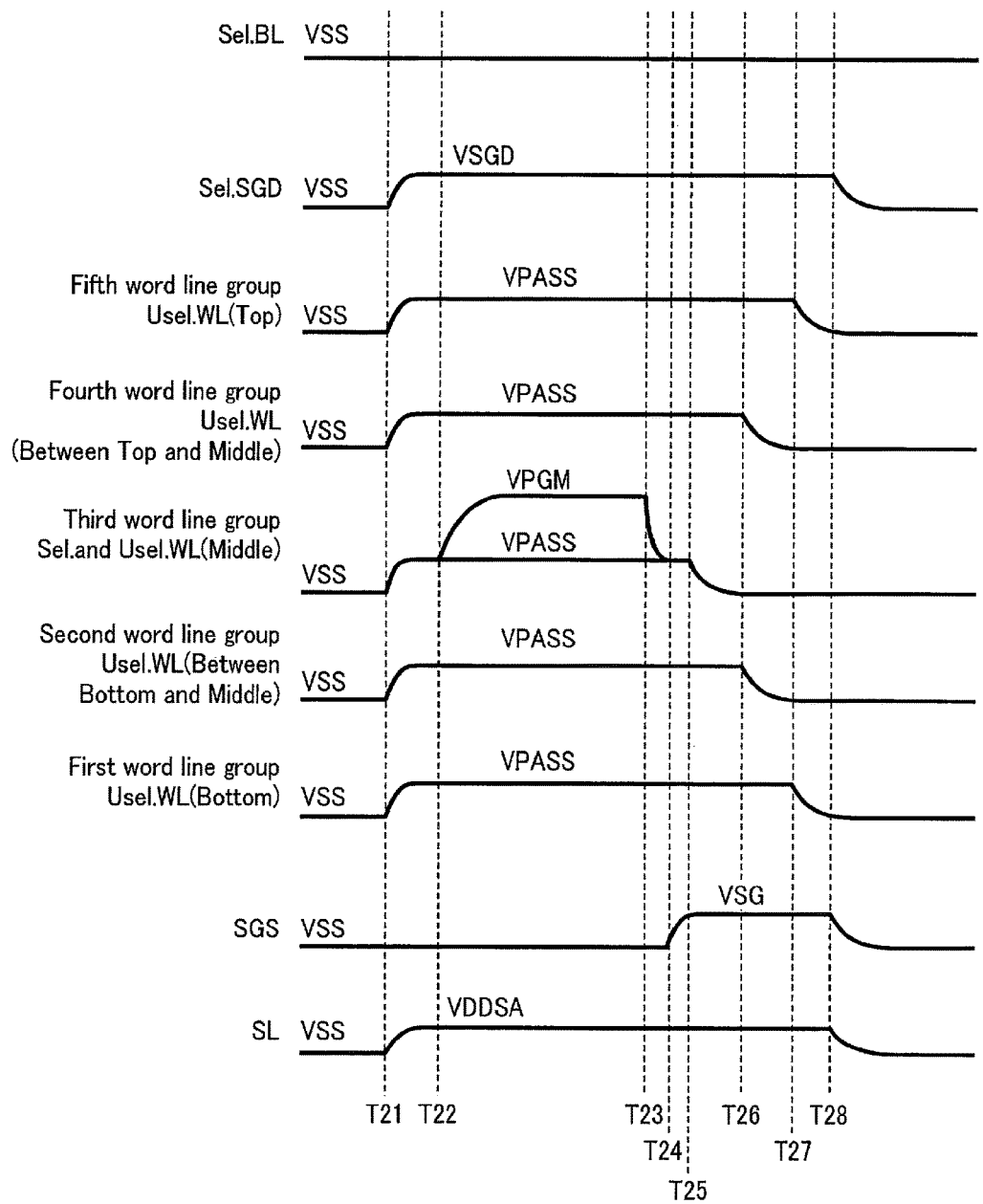
FIG. 8 is a timing chart showing various voltages at the time of a program in the semiconductor memory device according to the first embodiment.

FIG. 8 is a timing chart showing various voltages at the time of the program in the semiconductor memory device 1 according to the first embodiment. That is, FIG. 8 shows the program in each loop of FIG. 7. In this example, the NAND string 6 shown in FIG. 5 is selected, and the voltages supplied to the various control lines of FIG. 5 are shown. FIG. 8 shows an example in which the third word line group includes the selected word line WL.

As shown in FIG. 8, at time T21, the sense amplifier 4 applies the voltage VSS to the selected bit line BL. On the other hand, the voltage of the source line SL rises from the voltage VSS to a voltage VDDSA. The row decoder 3 raises the voltage of the select gate line SGD from the voltage to the voltage VSGD. On the other hand, the row decoder 3 applies the voltage VSS to the select gate line SGS. This turns on the select transistor ST1 and turns off the select transistor ST2.

Although not shown, before time T21, the voltage VDDSA is applied to the unselected bit lines BL, and the voltage VSG_PROG is applied to the select gate lines SGD, thereby boosting the channels of the unselected NAND strings.

Furthermore, at time T21, the row decoder 3 raises the voltages the unselected word lines WL from the voltage VSS to the voltage VPASS. In this example, the voltage VPASS is applied to the unselected word lines WL of the first to fifth word line groups. The voltage VPASS is a voltage that turns on all the memory cell transistors MT regardless of the thresholds of the memory cell transistors MT. This turns on the memory cell transistors MT coupled to the unselected word lines.

Continuously, at time T22, the row decoder 3 raises the voltage of the selected word line WL of the third word line group from the voltage VPASS to the voltage VPGM. The voltage VPGM is a high voltage for injecting electrons into the charge storage layer by the tunnel phenomenon. This writes data in the memory cell transistor MT coupled to the selected word line WL.

After data write, at time T23, the row decoder 3 lowers the voltage of the selected word line WL of the third word line group from the voltage VPGM to the voltage VPASS.

At time T24, the row decoder 3 raises the voltage of the select gate line SGS from the voltage VSS to the voltage VSG. This turns on the select transistor ST2.

After that, the voltages of the various control lines are lowered to the voltage VSS after time T25. First, at time T25, the row decoder 3 lowers the voltages of the word lines WL of the third word line group to the voltage VSS. At this time, both the voltages of the selected word line WL and unselected word line WL of the third word line group are lowered.

Next, at time T26, the row decoder 3 lowers the voltages of the word lines WL of the second and fourth word line groups to the voltage VSS. At time T27, the row decoder 3 lowers the voltages of the word lines WL of the first and fifth word line groups to the voltage VSS. After that, at time T28, the voltages of the source line SL and select gate lines SGS and SGD are lowered to the voltage VSS.

That is, the voltages of the word lines WL of the third word line group, the word lines WL of the second and fourth word line groups, the word lines WL of the first and fifth word line groups, and the select gate lines SGS and SGD sequentially start to lower. This sequentially turns off the memory cell transistors MT of the middle word line group, the memory cell transistors MT between the bottom and middle word line groups and between the top and middle word line groups, the memory cell transistors MT of the bottom and top word line groups, and the select transistors ST1 and ST2.

Figure 9:
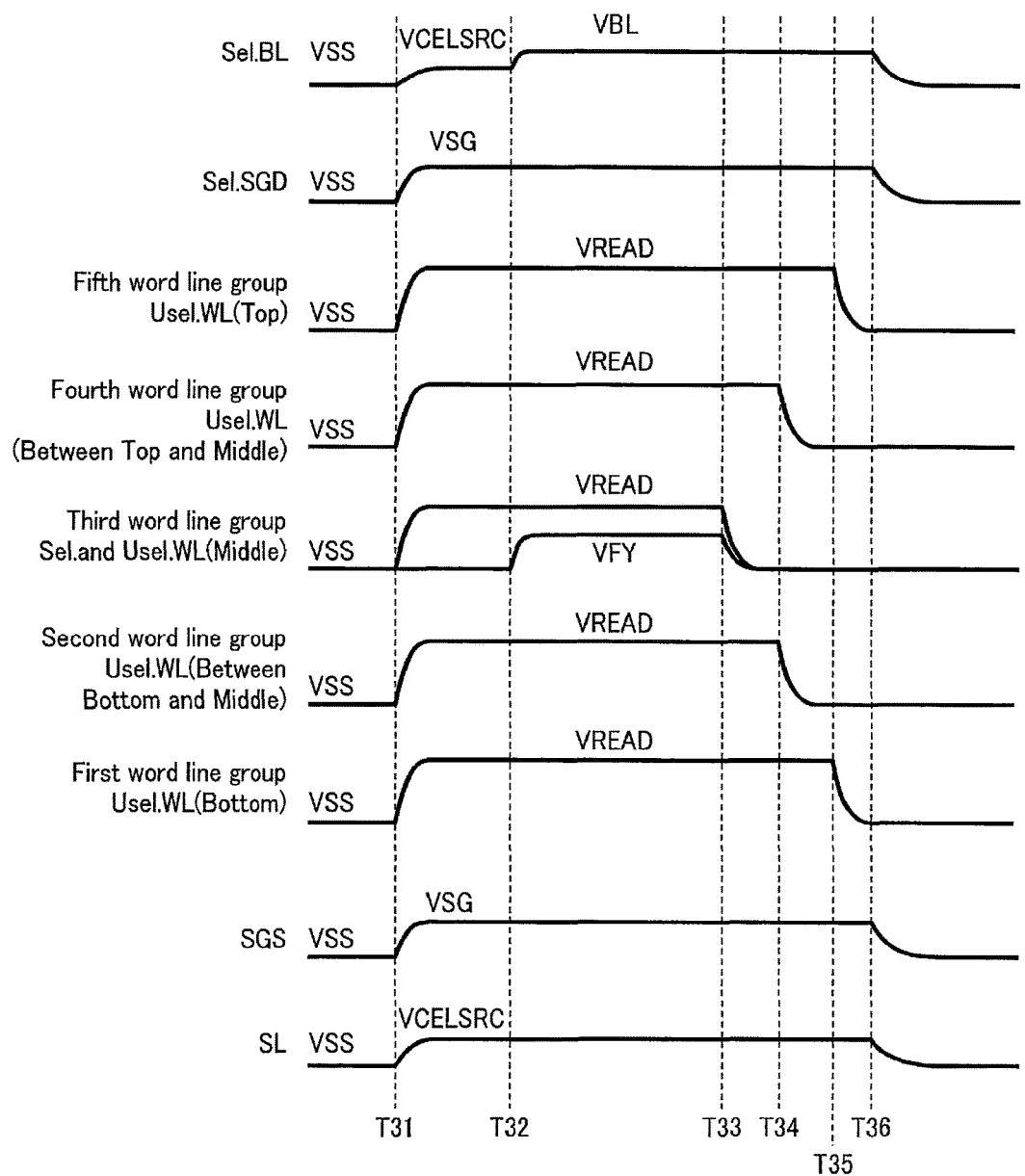
FIG. 9 is a timing chart showing various voltages at the time of a verify in the semiconductor memory device according to the first embodiment.

FIG. 9 is a timing chart showing various voltages at the time of the verify in the semiconductor memory device 1 according to the first embodiment. That is, FIG. 9 shows the verify in each loop of FIG. 7. In this example, the NAND string 6 shown in FIG. 5 is selected, and the voltages supplied to the various control lines of FIG. 5 are shown. FIG. 9 shows an example in which the third word line group includes the selected word line WL.

As shown in FIG. 9, at time T31, the sense amplifier 4 raises the voltage of the selected bit line BL from the voltage VSS to the voltage VCELSRC. On the other hand, the voltage of the source line SL rises from the voltage VSS to the voltage VCELSRC. Although not shown, the voltage VCELSRC is applied to the unselected bit lines BL. The row decoder 3 raises the voltages of the select gate lines SGD and select gate line SGS from the voltage VSS to the voltage VSG. This turns on the select transistors ST1 and ST2.

Furthermore, at time T31, the row decoder 3 raises the voltages of the unselected word lines WL from the voltage VSS to the voltage VREAD. In this example, the voltage VREAD is applied to the unselected word lines WL of the first to fifth word line groups. This turns on the memory cell transistors MT coupled to the unselected word lines.

Continuously, at time T32, the sense amplifier 4 raises the voltage of the selected bit line BL to the voltage VBL. After the selected bit line BL is charged to the voltage VBL, the row decoder 3 raises the voltage of the selected word line WL of the third word line group from the voltage VSS to the voltage VFY. The voltage VFY is at a verify level corresponding to the threshold of the memory cell transistor MT, and satisfies VFY<VREAD. This reads data in accordance with ON/OFF of the memory cell transistor MT coupled to the selected word line WL.

After data read, the voltages of the various control lines are lowered to the voltage VSS after time T33. At time T33, the row decoder 3 lowers the voltages of the word lines WL of the third word line group to the voltage VSS. At this time, both the voltages of the selected word line WL and unselected word line WL of the third word line group are lowered.

Next, at time T34, the row decoder 3 lowers the voltages of the word lines WL of the second and fourth word line groups to the voltage VSS. At time T35, the row decoder 3 lowers the voltages of the word lines WL of the first and fifth word line groups to the voltage VSS. After that, at time T36, the voltages of the bit line BL, source line SL, and select gate lines SGS and SGD are lowered to the voltage VSS.

That is, the voltages of the word lines WL of the third word line group, the word lines WL of the second and fourth word line groups, the word lines WL of the first and fifth word line groups, and the select gate lines SGS and SGD sequentially start to lower. This sequentially turns off the memory cell transistors MT of the middle word line group, the memory cell transistors MT between the bottom and middle word line groups and between the top and middle word line groups, the memory cell transistors MT of the bottom and top word line groups, and the select transistors ST1 and ST2.

[Effect of First Embodiment]

Figure 10:
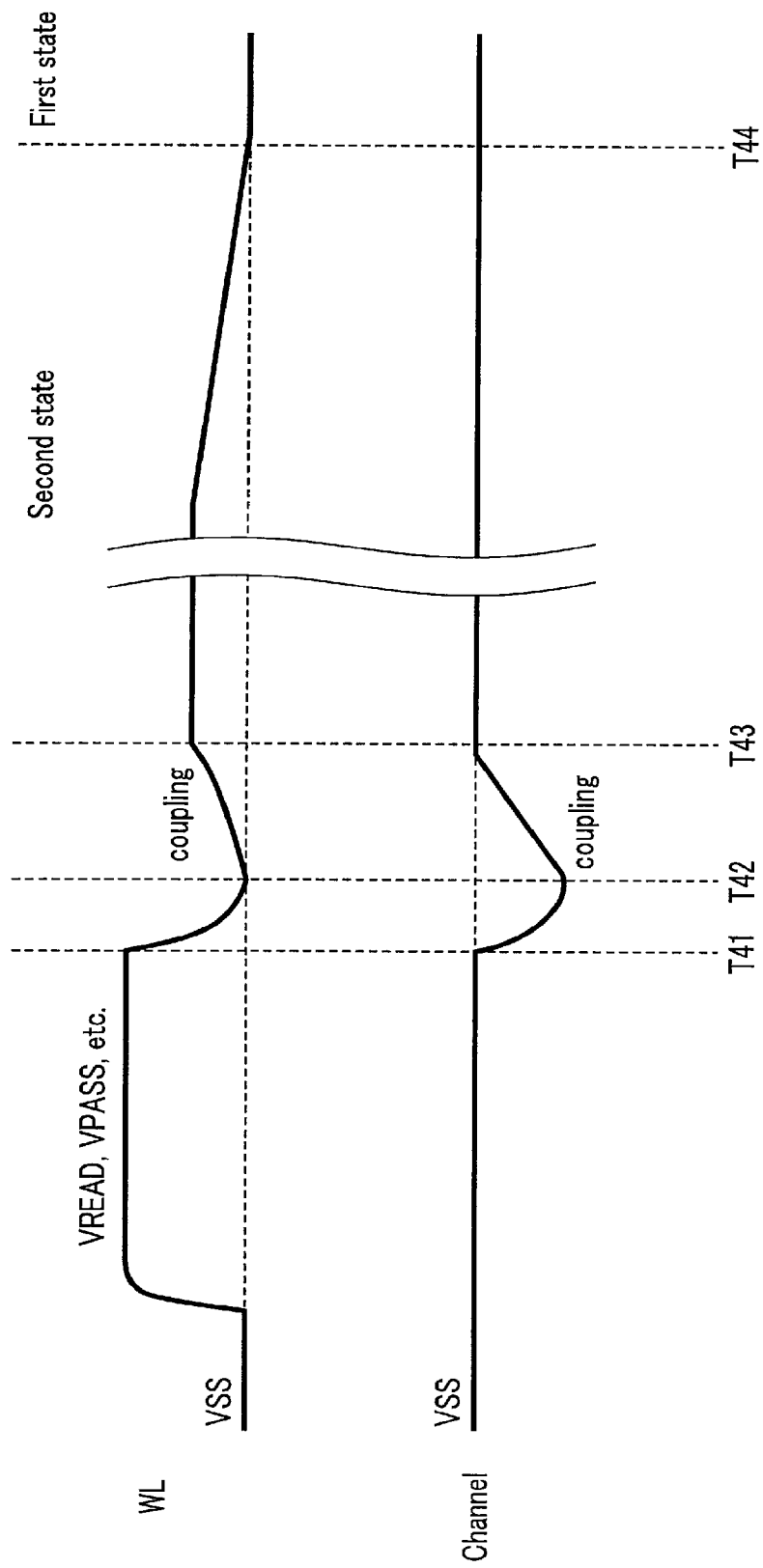
FIG. 10 is a timing chart showing the voltages of word lines and channels at the time of a read, write, and verify in a semiconductor memory device according to a comparative example.
Figure 11:
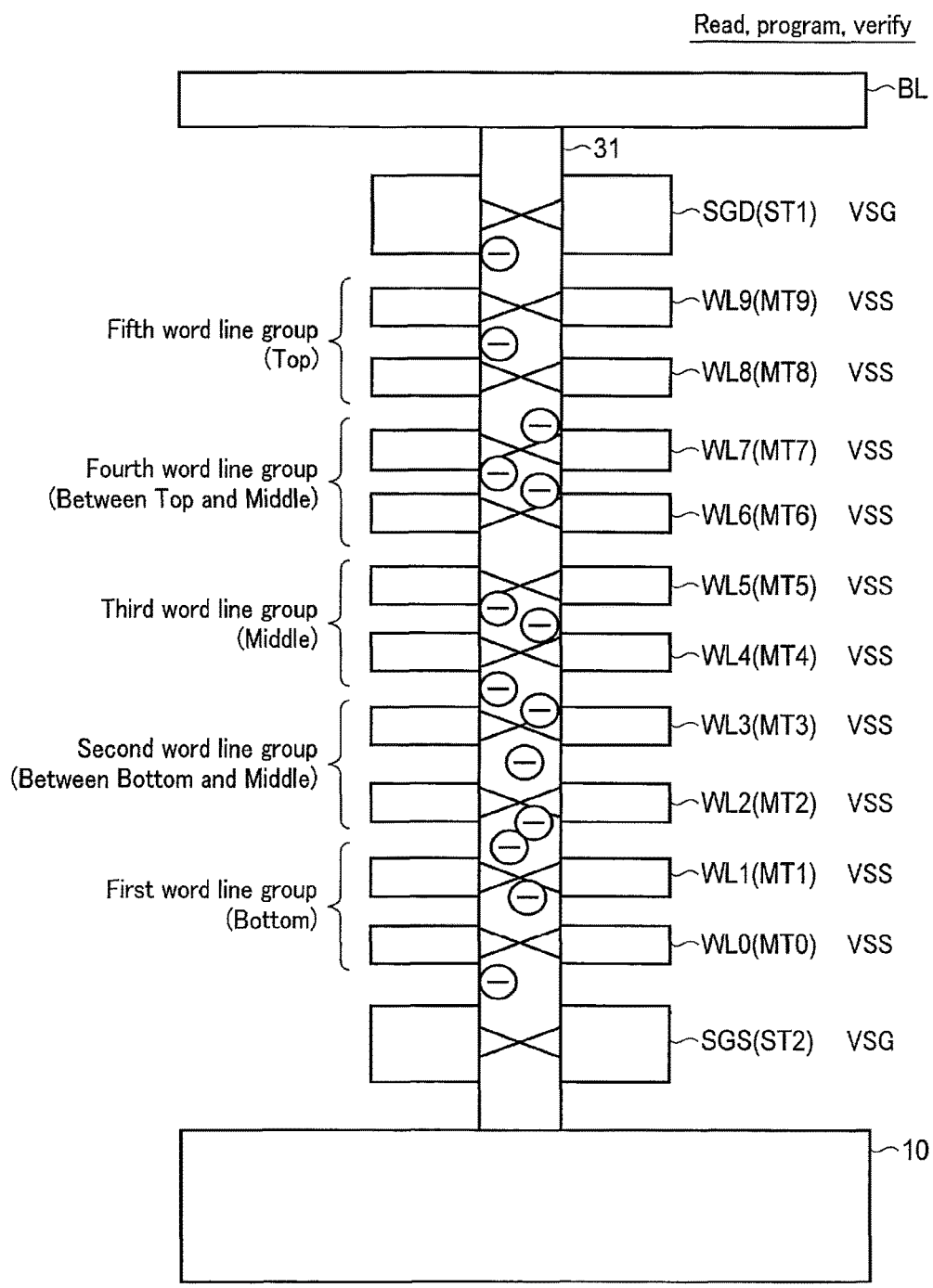
FIG. 11 is a sectional view showing a NAND string at the time of the read, write, and verify in the semiconductor memory device according to the comparative example.
Figure 12:
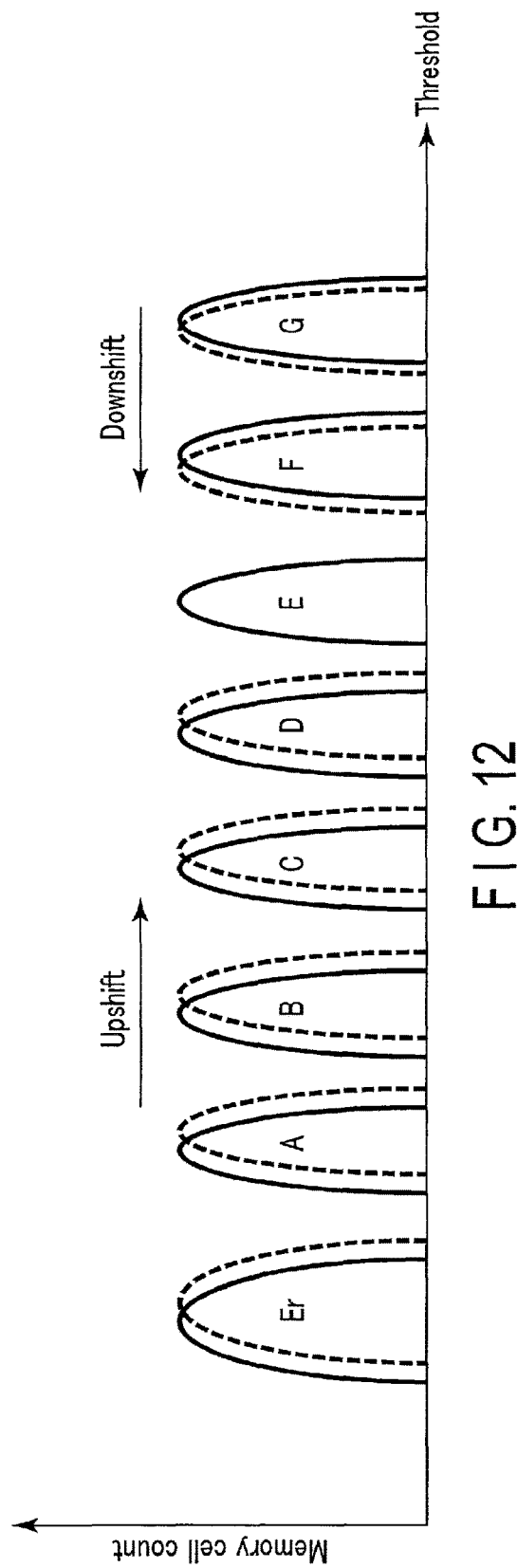
FIG. 12 is a graph showing examples of the threshold distributions of each memory cell transistor in the semiconductor memory device according to the comparative example.
Figure 13:
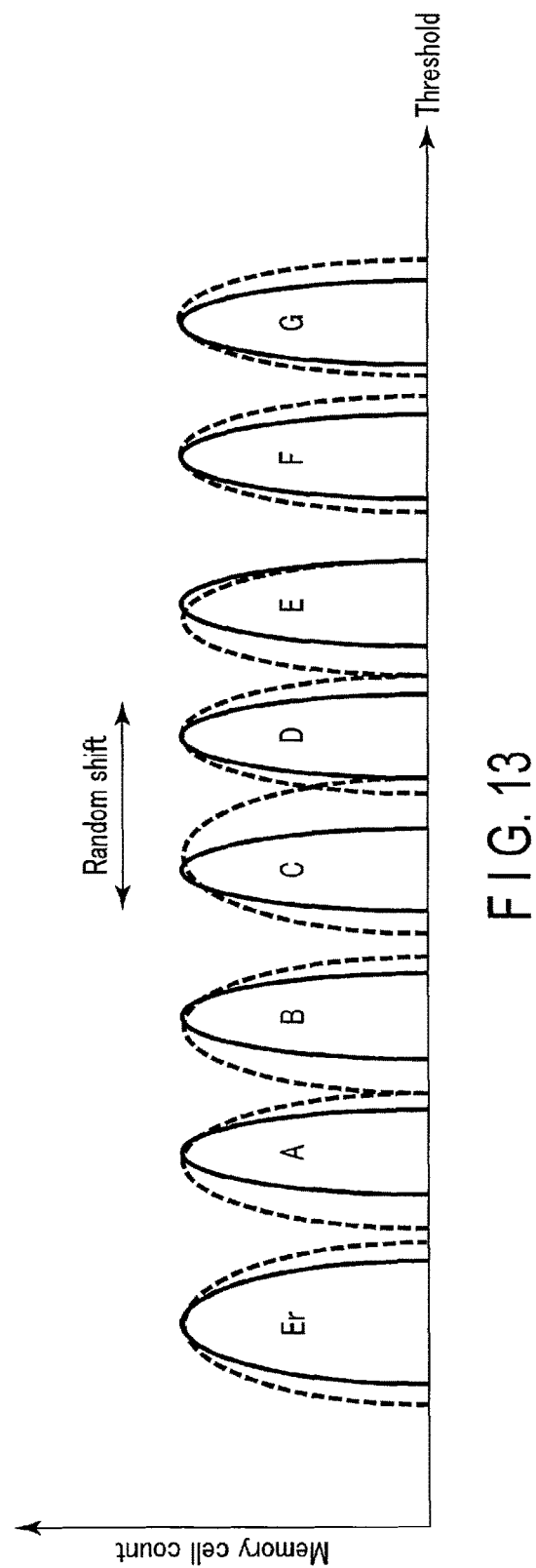
FIG. 13 is a graph showing other examples of the threshold distributions of each memory cell transistor in the semiconductor memory device according to the comparative example.

FIG. 10 is a timing chart showing the voltages of word lines WL and channels at the time of a read, write, and verify in a semiconductor memory device according to a comparative example. FIG. 11 is a sectional view showing a NAND string 6 at the time of the read, write, and verify in the semiconductor memory device according to the comparative example. FIG. 12 is a graph showing examples of the threshold distributions of each memory cell transistor MT in a semiconductor memory device 1 according to the comparative example. FIG. 13 is a graph showing other examples of the threshold distributions of each memory cell transistor MT in the semiconductor memory device 1 according to the comparative example.

As shown in FIG. 10, in the comparative example, all the word lines WL and select gate lines SGS and SGD fall (lower to the voltage VSS) at the same time in the read, write, and verify. If the word lines WL fall, the voltages of the channels of the NAND string 6 also lower by coupling (time T41 to time T42). At this time, as shown in FIG. 11, all the memory cell transistors MT and the select transistors ST1 and ST2 are turned off at the same time. Therefore, negative charges (electrons) in the channels generated by coupling with the word lines WL remain without exiting to the well region 10 and the bit line BL. As a result, the voltages of the channels of the NAND string 6 largely lower.

After that, the charges in the channels slowly exit to the well region 10 and the bit line BL as a leak current, and the voltages of the channels rise (time T42 to time T43). As a result, however, the voltages of the word lines WL of the NAND string 6 also rise by coupling. Since the word lines WL are coupled to a switching transistor having high cutoff performance, the positive charges in the word lines WL generated by coupling remain for a period longer than the charges in the channels (time T43 to time T44).

The threshold of each memory cell transistor MT shifts between a state (time T43 to time T44: second state) in which the voltage is applied to the word lines WL and a state (after time T44: first state) in which no voltage is applied to the word lines WL. For example, as shown in FIG. 12, when the state transits from the first state to the second state, the threshold of each memory cell transistor MT in the Er level, A level, B level, C level, or D level is upshifted, and the threshold of each memory cell transistor MT in the F level or G level is downshifted. As shown in FIG. 13, when the state transits from the first state to the second state, the threshold of each memory cell transistor MT randomly shifts. To the contrary, when the state transits from the second state to the first state, the threshold of each memory cell transistor MT may randomly shift.

As described above, the threshold of each memory cell transistor MT shifts due to transition from the first state to the second state or from the second state to the first state, and thus the appropriate read level at the time of the read and verify shifts. As a result, fail bits (bits holding error data) increase. Therefore, it is necessary for the memory cell transistors MT to maintain the first state (or second state) at the end of read, program, and verify.

Figure 14:
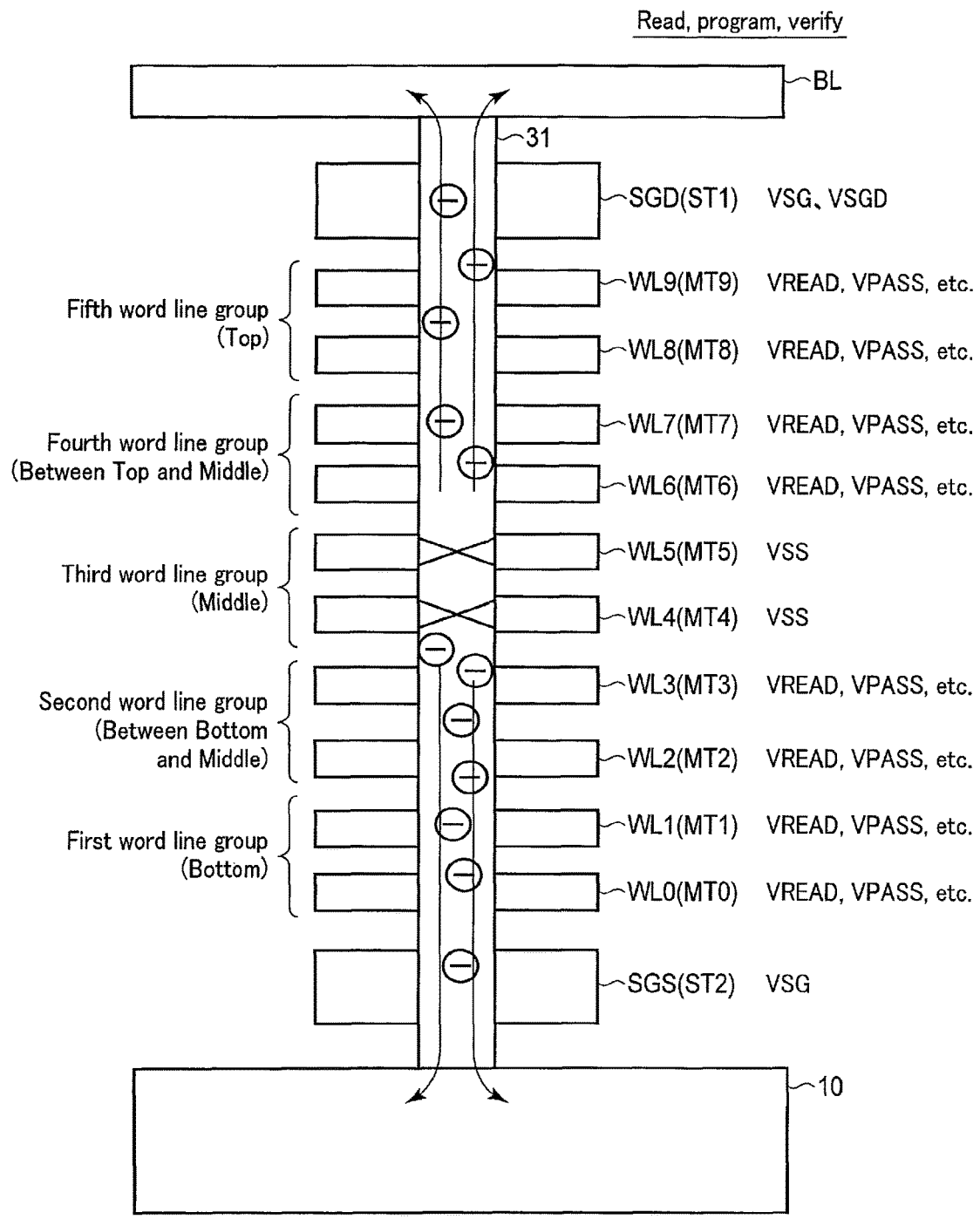
Figure 15:
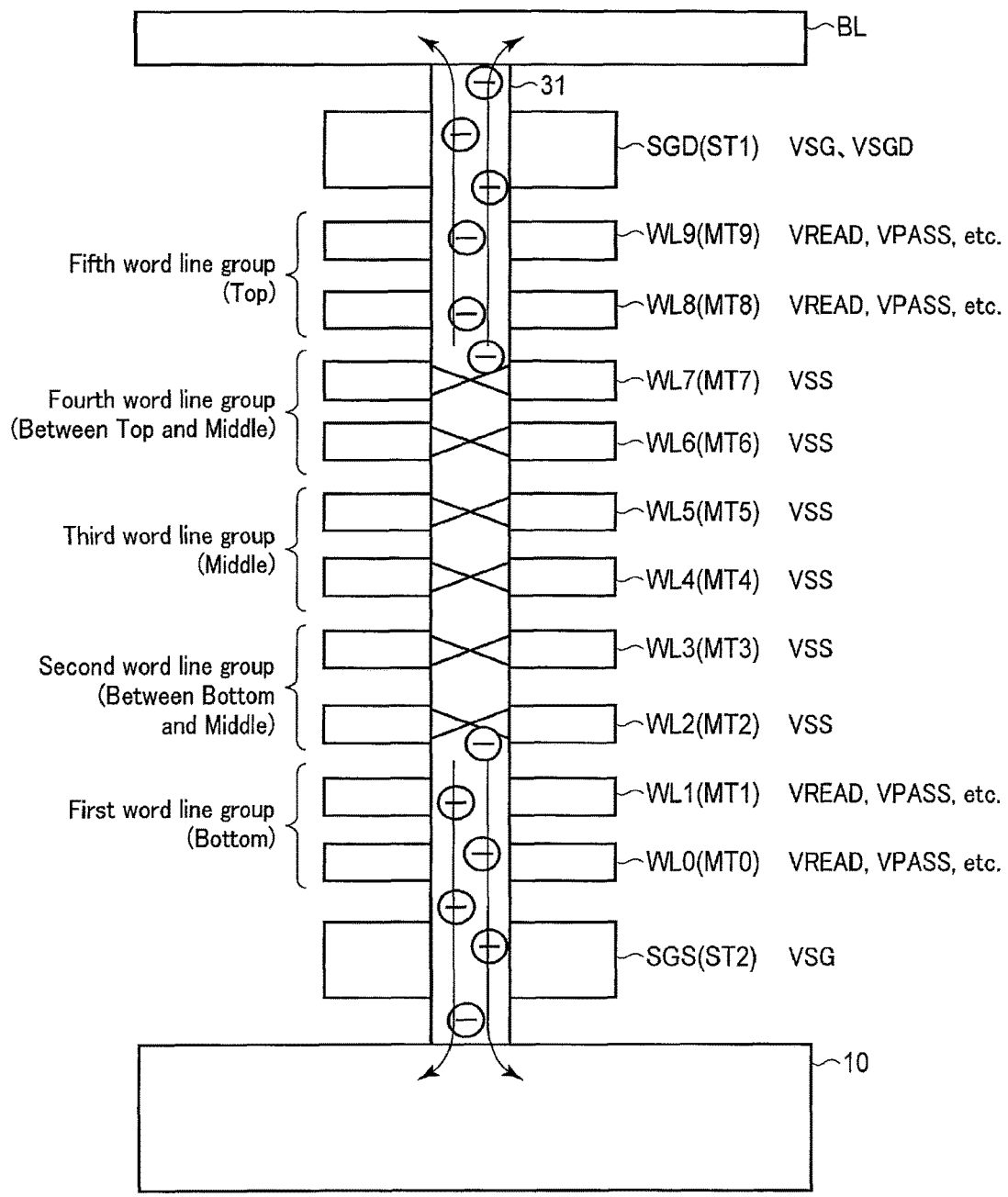

FIGS. 14, 15, and 16 are sectional views each showing the NAND string 6 at the time of the read, program, and verify in the semiconductor memory device according to the first embodiment.

As shown in FIGS. 14, 15, and 16, according to the first embodiment, to solve the above problem, the fall timings of the word lines WL are controlled on a group basis in the read, program, and verify. More specifically, the third word line group falls first. Next, the second and fourth word line groups fall. After that, the first and fifth word line groups fall. This sequentially turns off the memory cell transistors MT of the middle word line group, the memory cell transistors MT between the bottom and middle word line groups and between the top and middle word line groups, and the memory cell transistors MT of the bottom and top word line groups. Consequently, the charges in the channels generated by coupling with the word lines WL exit to the bit line BL or well region 10 without being cut off. Therefore, it is possible to suppress voltage drops in the channels and subsequent voltage rises in the word lines WL, and maintain the memory cell transistors MT in the first state. As a result, it is possible to suppress a shift of the threshold of each memory cell transistor MT and suppress an increase in fail bits.

Note that in the first embodiment, the word lines are divided into the first to fifth word line groups and independently controlled. The number of word line groups is not limited to this. All the word lines WL may be independently controlled. In this case as well, the voltages of the word lines WL sequentially fall from the word lines WL of the middle word line group toward the word lines of the top and bottom word line groups.

Furthermore, if no random shift occurs between the first and second states, it is unnecessary to apply this embodiment in the program and verify in loops 1 to k−1 in the write. In this case, it is only necessary to apply this embodiment in the program and verify in last loop k in the write. At this time, it is preferable to set the verify level in loops 1 to k−1 to a level in consideration of an upshift or downshift in the second state, and set the verify level in loop k to the level in the first state.

Second Embodiment

A semiconductor memory device according to the second embodiment will be described below with reference to FIGS. 17, 18, and 19. In the second embodiment, the fall start timings of word lines WL are the same in all groups, and the falling rates of the word lines WL are independently controlled on a group basis. The second embodiment will be described in detail below.

Note that in the second embodiment, the difference from the above-described first embodiment will mainly be explained and a description of the same points will be omitted.

[Read Example of Second Embodiment]

Figure 17:
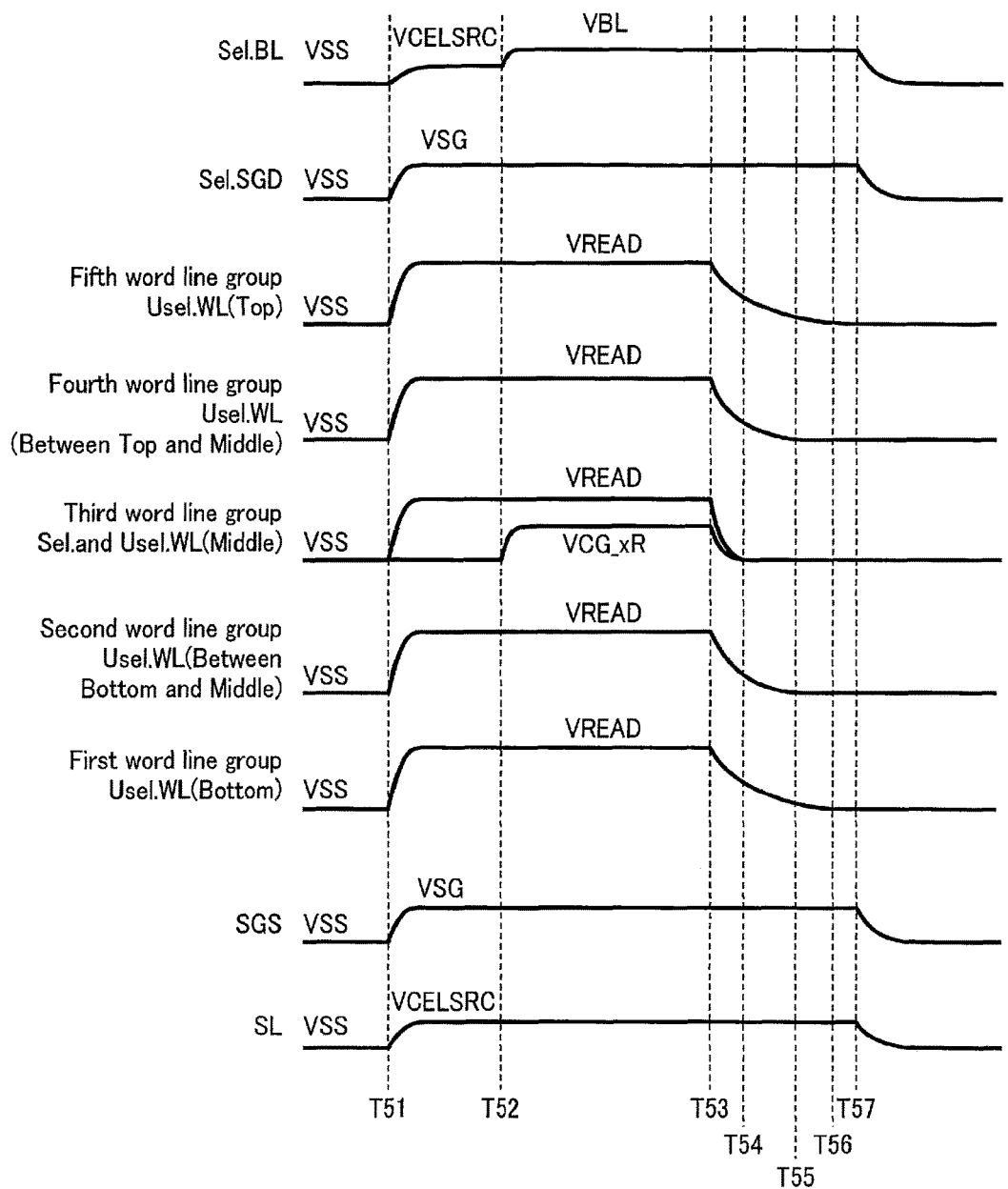
FIG. 17 is a timing chart showing various voltages at the time of a read in a semiconductor memory device according to the second embodiment.

FIG. 17 is a timing chart showing various voltages at the time of a read in a semiconductor memory device 1 according to the second embodiment. FIG. 17 shows an example in which the third word line group includes the selected word line WL.

As shown in FIG. 17, during a period from time T51 to time T52, the same operation as that during a period from time T11 to time T12 in the first embodiment is performed to read data.

After data read, the voltages of various control lines are lowered to a voltage VSS after time T53. At time T53, a row decoder 3 causes the voltages of the word lines WL of the first to fifth word line groups to start to lower to the voltage VSS (start to fall). At this time, all the voltages of the selected word line WL and unselected word lines WL of the first to fifth word line groups lower.

The voltage falling rates of the word lines WL are different for each group. More specifically, the first rate is set as the voltage falling rate of the third word line group, the second rate lower than the first rate is set as the voltage falling rate of the second and fourth word line groups, and the third rate lower than the second rate is set as the voltage falling rate of the first and fifth word line groups. This causes the voltages of the word lines WL of the third word line group to lower to the voltage VSS at time T54. After that, at time T55, the voltages of the word lines WL of the second and fourth word line groups lower to the voltage VSS. At time T56, the voltages of the word lines WL of the first and fifth word line groups lower to the voltage VSS. At time T57, the voltages of a bit line BL, a source line SL, and select gate lines SGS and SGD lower to the voltage VSS.

That is, the voltages of the word lines WL of the first to fifth word line groups start to lower at the same time but the voltage falling rates are different. Therefore, the voltages of the word lines WL of the third word line group, the word lines WL of the second and fourth word line groups, the word lines WL of the first and fifth word line groups, and the select gate lines SGS and SGD sequentially lower. This sequentially turns off memory cell transistors MT of the middle word line group, memory cell transistors MT between the bottom and middle word line groups and between the top and middle word line groups, memory cell transistors MT of the bottom and top word line groups, and select transistors ST1 and ST2.

[Write Example of Second Embodiment]

Figure 18:
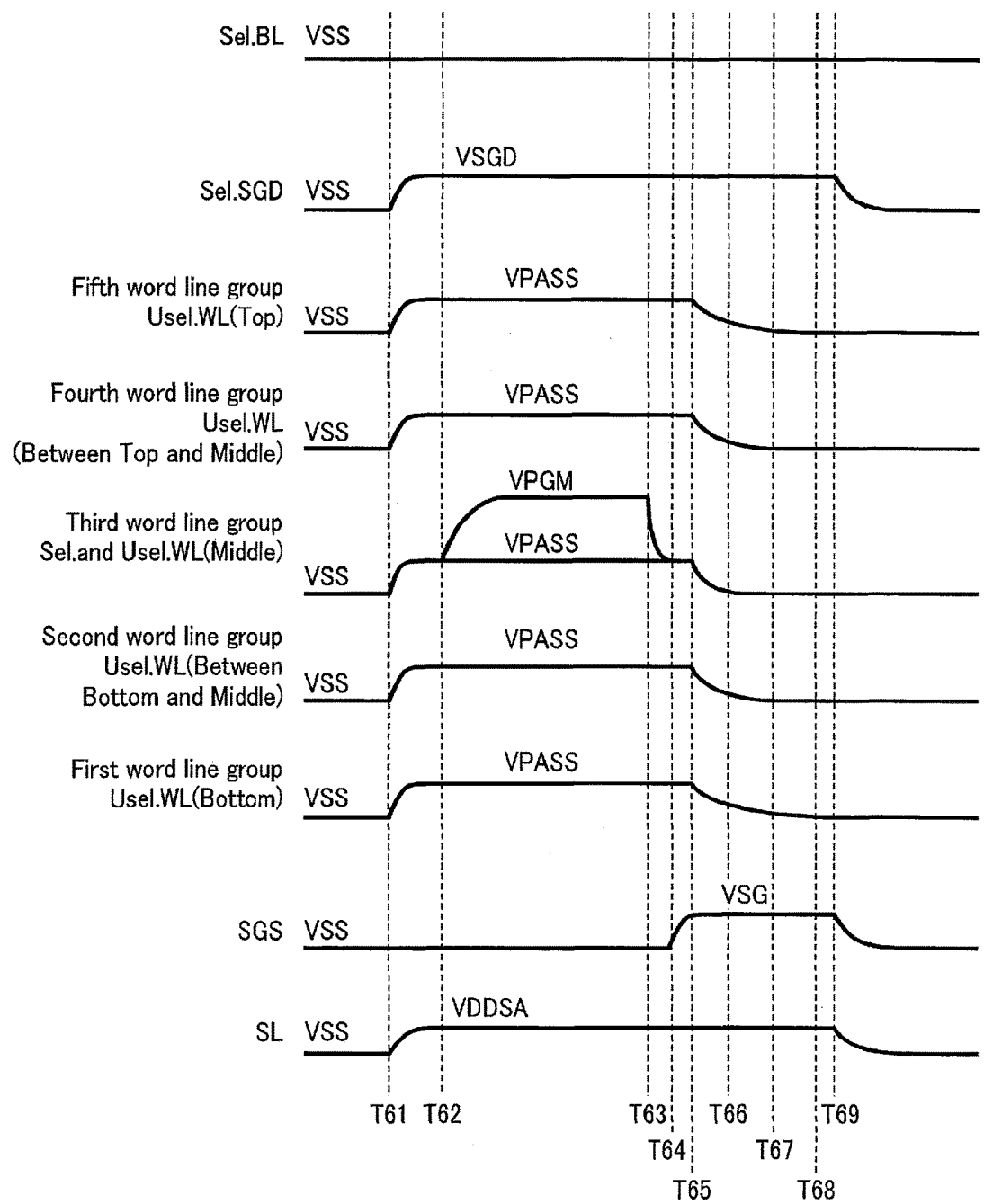
FIG. 18 is a timing chart showing various voltages at the time of a program in the semiconductor memory device according to the second embodiment.

FIG. 18 is a timing chart showing various voltages at the time of the program in the semiconductor memory device 1 according to the second embodiment. FIG. 18 shows an example in which the third word line group includes the selected word line WL.

As shown in FIG. 18, during a period from time T61 to time T64, the same operation as that during a period from time T21 to time T24 in the first embodiment is performed to write data.

After data write, the voltages of the various control lines are lowered to the voltage VSS after time T65. At time T65, the row decoder 3 causes the voltages of the word lines WL of the first to fifth word line groups to start to lower to the voltage VSS. At this time, all the voltages of the selected word line WL and unselected word lines WL of the first to fifth word line groups lower.

The voltage falling rates of the word lines WL are different for each group. More specifically, the first rate is set as the voltage falling rate of the third word line group, the second rate lower than the first rate is set as the voltage falling rate of the second and fourth word line groups, and the third rate lower than the second rate is set as the voltage falling rate of the first and fifth word line groups. This causes the word lines WL of the third word line group to lower to the voltage VSS at time T66. After that, at time T67, the word lines WL of the second and fourth word line groups lower to the voltage VSS. At time T68, the word lines WL of the first and fifth word line groups lower to the voltage VSS. At time T69, the voltages of the source line SL and select gate lines SGS and SGD lower to the voltage VSS.

That is, the voltages of the word lines WL of the first to fifth word line groups start to lower at the same time but the voltage falling rates are different. Therefore, the voltages of the word lines WL of the third word line group, the word lines WL of the second and fourth word line groups, the word lines WL of the first and fifth word line groups, and the select gate lines SGS and SGD sequentially lower. This sequentially turns off the memory cell transistors MT of the middle word line group, the memory cell transistors MT between the bottom and middle word line groups and between the top and middle word line groups, the memory cell transistors MT of the bottom and top word line groups, and the select transistors ST1 and ST2.

Figure 19:
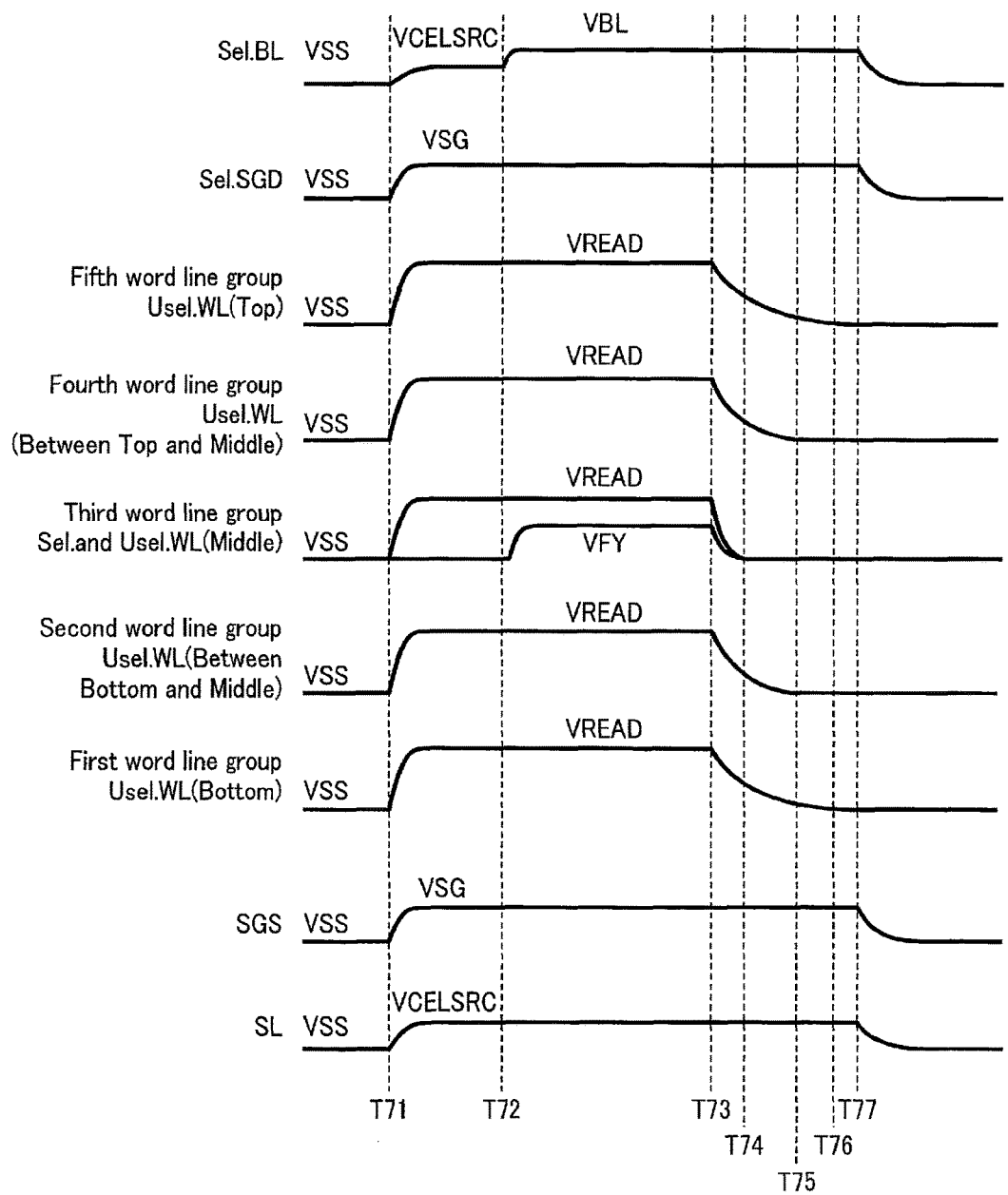
FIG. 19 is a timing chart showing various voltages at the time of a verify in the semiconductor memory device according to the second embodiment.
Figure 21:
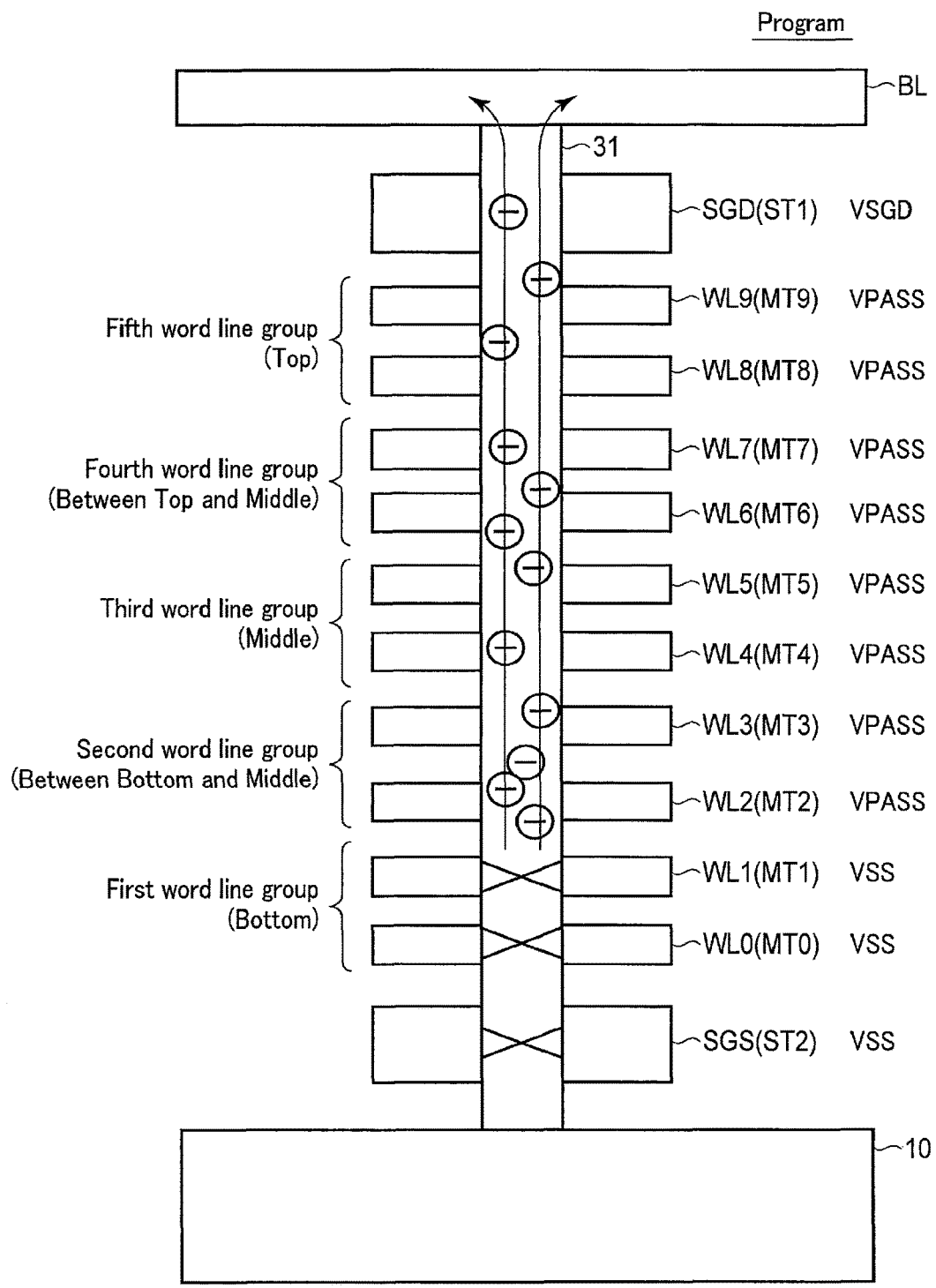
Figure 23:
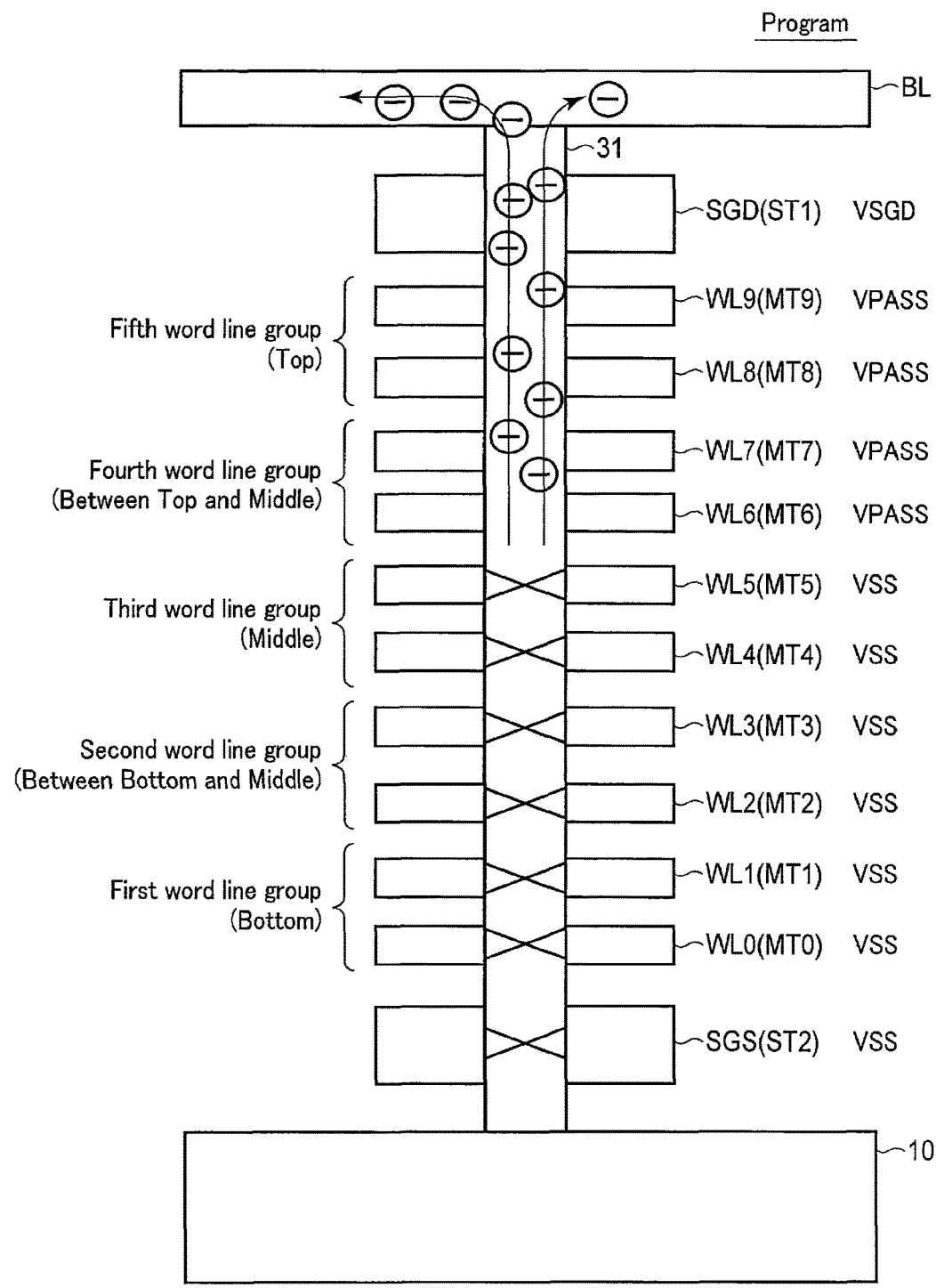

FIG. 19 is a timing chart showing various voltages at the time of the verify in the semiconductor memory device 1 according to the second embodiment. FIG. 19 shows an example in which the third word line group includes the selected word line WL.

As shown in FIG. 19, during a period from time T71 to time T72, the same operation as that during a period from time T31 to time T32 in the first embodiment is performed to read data.

After data read, the voltages of the various control lines are lowered to the voltage VSS after time T73. At time T73, the row decoder 3 causes the voltages of the word lines WL of the first to fifth word line groups to start to lower to the voltage VSS. At this time, all the voltages of the selected word line WL and unselected word lines WL of the first to fifth word line groups lower.

The voltage falling rates of the word lines WL are different for each group. More specifically, the first rate is set as the voltage falling rate of the third word line group, the second rate lower than the first rate is set as the voltage falling rate of the second and fourth word line groups, and the third rate lower than the second rate is set as the voltage falling rate of the first and fifth word line groups. This causes the word lines WL of the third word line group to lower to the voltage VSS at time T74. After that, at time T75, the word lines WL of the second and fourth word line groups lower to the voltage VSS. At time T76, the word lines WL of the first and fifth word line groups lower to the voltage VSS. At time T77, the voltages of the bit line BL, source line SL, and select gate lines SGS and SGD lower to the voltage VSS.

That is, the voltages of the word lines WL of the first to fifth word line groups start to lower at the same time but the voltage falling rates are different. Therefore, the voltages of the word lines WL of the third word line group, the word lines WL of the second and fourth word line groups, the word lines WL of the first and fifth word line groups, and the select gate lines SGS and SGD sequentially lower. This sequentially turns off the memory cell transistors MT of the middle word line group, the memory cell transistors MT between the bottom and middle word line groups and between the top and middle word line groups, the memory cell transistors MT of the bottom and top word line groups, and the select transistors ST1 and ST2.

[Effect of Second Embodiment]

According to the second embodiment, in the read, write, and verify, the fall start timings of the word lines WL are the same in all the groups, and the falling rates of the word lines WL are independently controlled on a group basis. More specifically, the third word line group falls at the first rate, the second and fourth word line groups fall at the second rate, and the first and fifth word line groups fall at the third rate (first rate>second rate>third rate). This sequentially turns off the memory cell transistors MT of the middle word line group, the memory cell transistors MT between the bottom and middle word line groups and between the top and middle word line groups, and the memory cell transistors MT of the bottom and top word line groups. This makes it possible to obtain the same effect as in the first embodiment.

Third Embodiment

A semiconductor memory device according to the third embodiment will be described below with reference to FIGS. 20, 21, 22, 23, 24, and 25. In the third embodiment, in a program, a select transistor ST2 is turned off, and thus the fall timings of word lines WL are independently controlled on a group basis so as to cause charges in channels to exit to the side of a bit line BL. The third embodiment will be described in detail below.

Note that in the third embodiment, the difference from the above-described first embodiment will mainly be explained and a description of the same points will be omitted.

[Write Example of Third Embodiment]

FIG. 20 is a timing chart showing various voltages at the time of the program in a semiconductor memory device 1 according to the third embodiment. FIG. 20 shows an example in which the third word line group includes the selected word line WL.

As shown in FIG. 20, during a period from time T81 to time T83, the same operation as that during a period from time T21 to time T23 in the first embodiment is performed to write data.

After data write, the voltage of a select gate line SGS is not raised and is maintained at a voltage VSS. This keeps the select transistor ST2 OFF.

After time T84, the voltages of various control lines are lowered to the voltage VSS. At time T84, a row decoder 3 lowers the voltages of the word lines WL of the first word line group to the voltage VSS.

Next, at time T85, the row decoder 3 lowers the voltages of the word lines WL of the second word line group to the voltage VSS. After that, at time T86, the row decoder 3 lowers the voltages of the word lines WL of the third word line group to the voltage VSS. At time T87, the row decoder 3 lowers the voltages of the word lines WL of the fourth word line group to the voltage VSS. At time T88, the row decoder 3 lowers the voltages of the word lines WL of the fifth word line group to the voltage VSS. In addition, at time T89, the voltages of a source line SL and a select gate line SGD are lowered to the voltage VSS.

That is, the voltages of the word lines WL of the first word line group, the word lines WL of the second word line group, the word lines WL of the third word line group, the word lines WL of the fourth word line group, the word lines WL of the fifth word line group, and the select gate line SGD sequentially start to lower. This sequentially turns off memory cell transistors MT of the bottom word line group, memory cell transistors MT between the bottom and middle word line groups, memory cell transistors MT of the middle word line group, memory cell transistors MT between the top and middle word line groups, memory cell transistors MT of the top word line group, and a select transistor ST1.

[Effect of Third Embodiment]

FIGS. 21, 22, 23, 24, and 25 are sectional views each showing a NAND string 6 at the time of the program in the semiconductor memory device 1 according to the third embodiment.

In general, in the program, the select transistor ST2 is turned off. Therefore, as shown in FIGS. 21, 22, 23, 24, and 25, according to the third embodiment, in the program, the fall timings of the word lines WL are independently controlled on a group basis so as to cause charges in the channels to exit to only the side of the bit line BL. More specifically, the first word line group falls first. After that, the second, third, fourth, and fifth word line groups sequentially fall. This sequentially turns off the memory cell transistors MT of the bottom word line group, the memory cell transistors MT between the bottom and middle word line groups, the memory cell transistors MT of the middle word line group, the memory cell transistors MT between the top and middle word line groups, and the memory cell transistors MT of the top word line group. Thus, the charges generated in the channels exit to the bit line BL without being cut off. Therefore, it is possible to obtain the same effect as in the first embodiment.

Fourth Embodiment

A semiconductor memory device according to the fourth embodiment will be described below with reference to FIGS. 26, 27, 28, 29, and 30. In the fourth embodiment, in a program and verify, word line groups on the drain side (top side) with respect to a word line group including a selected word line WL fall first together with the middle third word line group. The fourth embodiment will be described in detail below.

Note that in the fourth embodiment, the difference from the above-described first embodiment will mainly be explained and a description of the same points will be omitted.

[Write Example of Fourth Embodiment]

FIG. 26 is a timing chart showing various voltages at the time of the program in a semiconductor memory device 1 according to the fourth embodiment. FIG. 26 shows an example in which the third word line group includes the selected word line WL.

As shown in FIG. 26, during a period from time T91 to T94, the same operation as that during a period from time T21 to T24 in the first embodiment is performed to write data.

After data write, the voltages of various control lines are lowered to a voltage VSS after time T95. At time T95, a row decoder 3 lowers the voltages of word lines WL of the third to fifth word line groups to the voltage VSS.

Next, at time T96, the row decoder 3 lowers the voltages of the word lines WL of the second word line group to the voltage VSS. After that, at time T97, the row decoder 3 lowers the voltages of the word lines WL of the third word line group to the voltage VSS. At time T98, the voltages of a source line SL and select gate lines SGD and SGD are lowered to the voltage VSS.

That is, the voltages of the word lines WL of the third to fifth word line groups lower first at the same time. After that, the voltages of the word lines WL of the second word line group, the word lines WL of the first word line group, and the select gate lines SGS and SGD sequentially lower. This turns off memory cell transistors MT of the middle word line group, memory cell transistors MT between the top and middle word line groups, and memory cell transistors MT of the top word line group at the same time. Then, memory cell transistors MT between the bottom and middle word line groups, memory cell transistors MT of the bottom word line group, and select transistors ST1 and ST2 are sequentially turned off.

Figure 27:
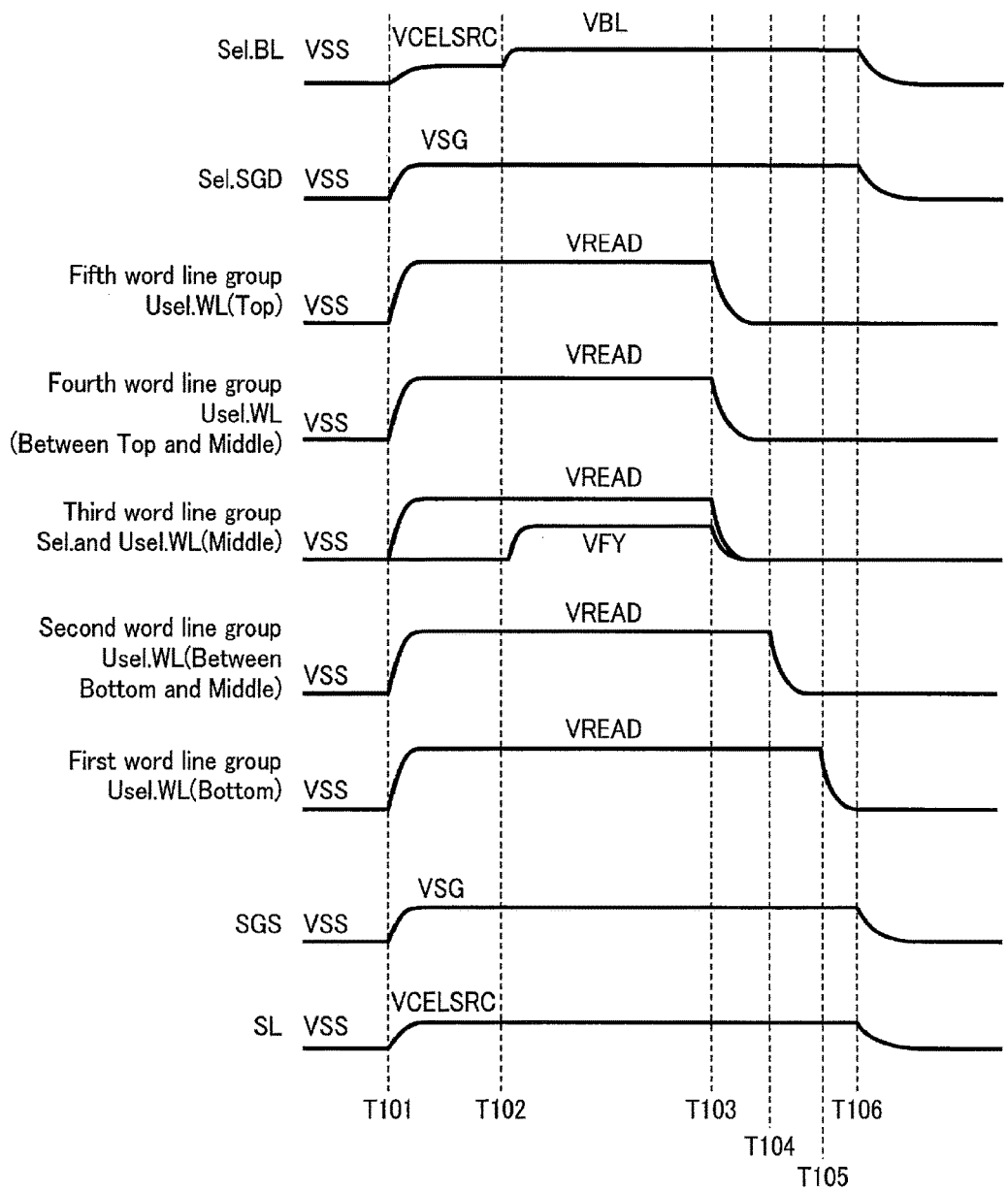
FIG. 27 is a timing chart showing various voltages at the time of a verify in the semiconductor memory device according to the fourth embodiment.

FIG. 27 is a timing chart showing various voltages at the time of the verify in the semiconductor memory device 1 according to the fourth embodiment. FIG. 27 shows an example in which the third word line group includes the selected word line WL.

As shown in FIG. 27, during a period from time T101 to time T102, the same operation as that during a period from time T31 to time T32 in the first embodiment is performed to read data.

After data read, the voltages of various control lines are lowered to the voltage VSS after time T103. At time T103, the row decoder 3 lowers the voltages of the word lines WL of the third to fifth word line groups to the voltage VSS.

Next, at time T104, the row decoder 3 lowers the voltages of the word lines WL of the second word line group to the voltage VSS. After that, at time T105, the row decoder 3 lowers the voltages of the word lines WL of the first word line group to the voltage VSS. At time T106, the row decoder 3 lowers the voltages of the source line SL and select gate lines SGS and SGD to the voltage VSS.

That is, the voltages of the word lines WL of the third to fifth word line groups lower at the same time. After that, the voltages of the word lines WL of the second word line group, the word lines WL of the first word line group, and the select gate lines SGS and SGD sequentially lower. This turns off the memory cell transistors MT of the middle word line group, the memory cell transistors MT between the top and middle word line groups MT, and the memory cell transistors MT of the top word line group at the same time. Then, the memory cell transistors MT between the bottom and middle word line groups, the memory cell transistors MT of the bottom word line group, and the select transistors ST2 and ST2 are sequentially turned off.

[Effect of Fourth Embodiment]

FIGS. 28, 29, and 30 are sectional views each showing a NAND string 6 at the time of the program and verify in the semiconductor memory device 1 according to the fourth embodiment.

In general, the program and verify are sequentially performed from the bottom side of the NAND string 6 to its top side. In this example, the third word line group includes the selected word line WL (the memory cell transistor MT as a write target). Thus, no write has been performed for the memory cell transistors MT of the fourth and fifth word line groups on the top side with respect to the third word line group. Therefore, even if the voltage VSS is applied to the fourth and fifth word line groups, the memory cell transistors MT of the fourth and fifth word line groups are not turned off.

Consequently, as shown in FIGS. 28, 29, and 30, according to the fourth embodiment, in the program and verify, the word line groups for which no write has been performed fall together with the middle third word line group. More specifically, in this example, the fourth and fifth word line groups first fall together with the third word line group. Then, the voltages of the second word line group, the first word line group, and the select gate lines SGS and SGD sequentially fall. This turns off the memory cell transistors MT of the middle word line group, the memory cell transistors MT between the top and middle word line groups, and the memory cell transistors MT of the top word line group are turned off, and then sequentially turns off the memory cell transistors MT between the middle and bottom word line groups, the memory cell transistors MT of the bottom word line group, and the select transistors ST1 and ST2. Therefore, it is possible to obtain the same effect as in the first embodiment.

Note that the example in which this embodiment is applied to the program and verify has been explained. The present invention, however, is not limited to this. If read is performed for blocks ELK for which no write has been performed, this embodiment may be applied to the read.

Fifth Embodiment

A semiconductor memory device according to the fifth embodiment will be described below with reference to FIGS. 31, 32, 33, 34, and 35. In the fifth embodiment, after a program (data write) in last loop k of a write, a word line WL and select gate lines SGS and SGD rise. Then, after the select gate lines SGS and SGD fall, the word line WL falls. The fifth embodiment will be described in detail below.

Note that in the fifth embodiment, the difference from the above-described first embodiment will mainly be explained and a description of the same points will be omitted.

[Write Example of Fifth Embodiment]

FIG. 31 is a timing chart showing the voltages of the word line WL and a bit line BL at the time of the write in a semiconductor memory device 1 according to the fifth embodiment.

As shown in FIG. 31, in the write according to the fifth embodiment, a program and a verify are performed in loops 1 to k−1, similarly to the first embodiment. On the other hand, in last loop k, no verify is performed and only the program is performed. That is, the write ends after the program is performed in loop k.

The program in loop k will be described in detail below.

FIG. 32 is a timing chart showing various voltages at the time of the program in the semiconductor memory device 1 according to the fifth embodiment. FIG. 32 shows the program in loop k shown in FIG. 31. A selected NAND string (a NAND string coupled to the selected bit line BL and the selected select gate line SGD) and unselected NAND strings (NAND strings (inhibited NAND strings) other than the selected NAND string) will be described below.

As shown in FIG. 32, at time T111, a sense amplifier 4 applies a voltage VSS to the selected bit line BL and raises the voltages of the unselected bit lines BL from the voltage VSS to a voltage VDDSA. On the other hand, the voltage of the source line SL rises from the voltage VSS to the voltage VDDSA. A row decoder 3 raises the voltage of the selected select gate line SGD from the voltage VSS to a voltage VSGD, and applies the voltage VSS to the unselected select gate lines SGD. On the other hand, the row decoder 3 applies the voltage VSS to the select gate line SGS. This turns on a select transistor ST1 of the selected NAND string and turns off a select transistor ST2 of the selected NAND string. On the other hand, select transistors ST1 and ST2 of the unselected NAND strings are turned off.

At time T111, the row decoder 3 raises the voltages of the unselected word lines WL and the selected word line WL from the voltage VSS to a voltage VPASS. This turns on all memory cell transistors MT.

Subsequently, at time T112, the row decoder 3 raises the voltage of the selected word line WL from the voltage VPASS to a voltage VPGM. This writes data in the memory cell transistor MT coupled to the selected word line WL of the selected NAND string.

After data write, at time T113, the row decoder 3 lowers the voltage of the selected word line WL from the voltage VPGM to the voltage VPASS.

At time T113, the sense amplifier 4 lowers the voltages of the unselected bit lines BL from the voltage VDDSA to the voltage VSS. The voltage of the source line SL lowers from the voltage VDDSA to the voltage VSS. The row decoder 3 raises the voltage of the selected select gate line SGD from the voltage VSGD to a voltage VSG, and raises the voltages of the unselected select gate lines SGD from the voltage VSS to the voltage VSGD. Furthermore, the row decoder 3 raises the voltage of the select gate line SGS from the voltage VSS to the voltage VSG. This turns on the select transistors ST1 and ST2 of the selected NAND string. Similarly, the select transistors ST1 and ST2 of the unselected NAND strings are turned on.

At time T114, the row decoder 3 lowers the voltage of the selected select gate line SGD from the voltage VSG to the voltage VSS, and lowers the voltages of the unselected select gate lines SGD from the voltage VSG to the voltage VSS. The row decoder 3 lowers the voltage of the select gate line SGS from the voltage VSG to the voltage VSS. This turns off the select transistors ST1 and ST2 of the selected NAND string. Similarly, the select transistors ST1 and ST2 of the unselected NAND strings are turned off.

After that, at time T115, the row decoder 3 lowers the voltages of the unselected word lines WL and the selected word line WL from the voltage VPASS to the voltage VSS.

[Effect of Fifth Embodiment]

Figure 34:
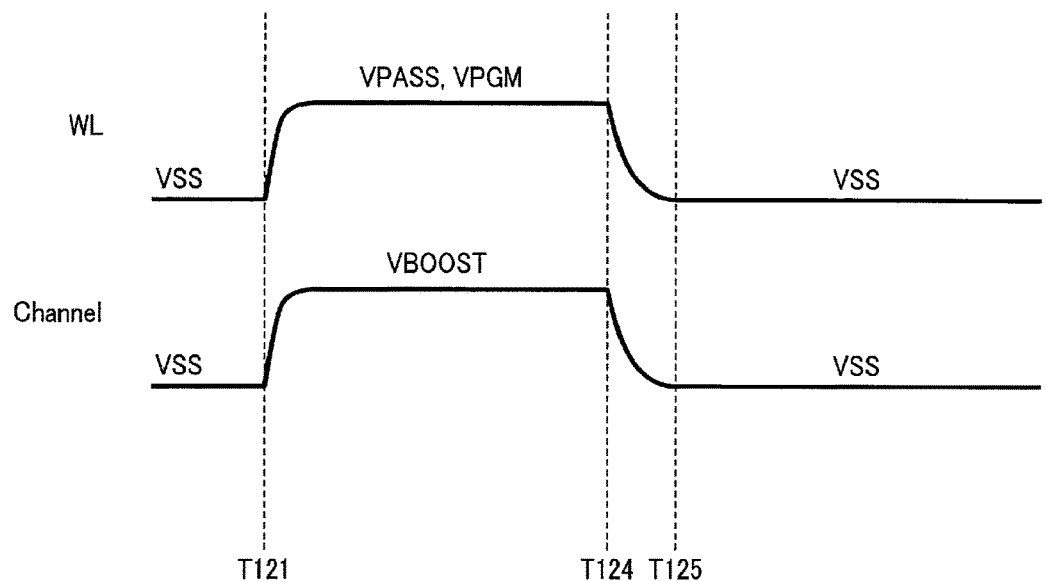
FIG. 34 is a timing chart showing the voltages of word lines and channels at the time of the program in the semiconductor memory device according to the comparative example.

FIG. 33 is a timing chart showing various voltages at the time of a program in a semiconductor memory device 1 according to comparative example. FIG. 34 is a timing chart showing the voltages of word lines WL and channels at the time of the program in the semiconductor memory device according to the comparative example.

As shown in FIG. 33, in the program according to the comparative example, during a period from time T121 to time T123, data is written in a memory cell transistor MT coupled to the selected word line WL of a selected NAND string. At time T124, the voltages of respective control lines are simultaneously lowered to a voltage VSS.

In this case, during the program, select transistors ST1 and ST2 of unselected NAND strings are OFF. Thus, the channels of the unselected NAND strings are in a floating state. Therefore, as shown in FIG. 34, at time T121, the channels of the unselected NAND strings are boosted to a voltage VBOOST along with rises in voltages of the word lines WL. At time T124, the voltages of the channels of the unselected NAND strings lower along with drops in voltages of the word lines WL. In this case, at time T125, the voltages of the channels of the unselected NAND strings lower to about the voltage VSS, similarly to the voltages of the word lines WL. With this operation, in the comparative example, after the program, the voltages of the channels never rise, and the voltages of the word lines never rise, either. Therefore, in the comparative example, after the program, the word lines WL are set in the first state.

To the contrary, in the fifth embodiment, the word lines WL can be set in the second state after the program, as follows.

Figure 35:
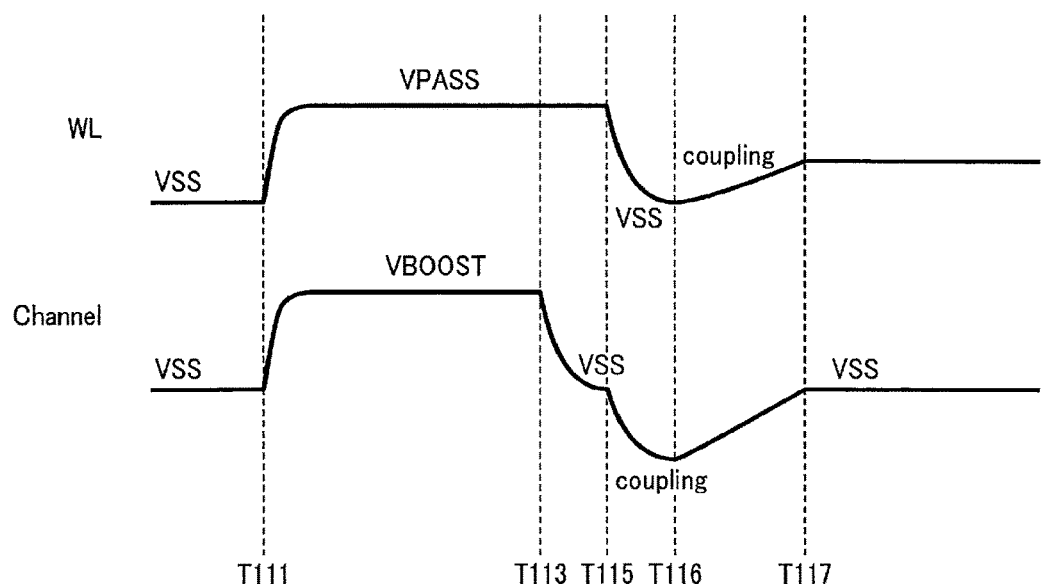
FIG. 35 is a timing chart showing the voltages of word lines and channels at the time of the program in the semiconductor memory device according to the fifth embodiment.

FIG. 35 is a timing chart showing the voltages of the word lines WL and channels at the time of the program in the semiconductor memory device 1 according to the fifth embodiment.

According to the fifth embodiment, after the word lines WL rise (the unselected NAND strings are boosted), the select gate lines SGS and SGD rise at time T113, as shown in FIG. 32. This turns on the select transistors ST1 and ST2 of the unselected NAND strings. Furthermore, the memory cell transistors MT are also ON. At this time, the bit lines BL and source line SL have the voltage VSS. As shown in FIG. 35, at time T113, the voltage VSS is supplied from the bit lines BL and source line SL to the channels of the unselected NAND strings.

As shown in FIG. 32, at time T114, the select gate lines SGS and SGD fall. This turns off the select transistors ST1 and ST2 of the unselected NAND strings. After that, at time T115, the word lines WL fall (the voltages lower to the voltage VSS). At this time, the channels of the unselected NAND strings are in the floating state. Therefore, as shown in FIG. 35, if the word lines WL fall, the voltages of the channels of the unselected NAND strings also lower by coupling (time T115 to time 116). After that, charges in the channels slowly exit to a well region 10 and the bit line BL as a leak current, and the voltages of the channels rise (time T116 to time T117). As a result, the voltages of the word lines WL also rise by coupling. That is, the word lines WL can be set in the second state. Therefore, according to the fifth embodiment, by maintaining not the first state but the second state, the respective operations including the program can be performed in the second state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell;
a second memory cell;
a first word line electrically coupled to the first memory cell;
a second word line electrically coupled to the second memory cell; and
a control circuit configured to supply voltages to the first word line and the second word line,
wherein in a read, the control circuit
applies a first voltage to the first word line and a second voltage to the second word line,
applies, after applying the first voltage to the first word line and the second voltage to the second word line, a third voltage lower than the first voltage and the second voltage to the second word line, and
applies, after applying the third voltage to the second word line, the third voltage to the first word line.

2. The device of claim 1, further comprising:
a third memory cell; and
a third word line electrically coupled to the third memory cell,
wherein the control circuit
applies, when applying the first voltage to the first word line and the second voltage to the second word line, a fourth voltage to the third word line, and
applies, when applying the third voltage to the first word line, the third voltage to the third word line.

3. The device of claim 2, further comprising:
a semiconductor substrate; and
a first bit line electrically coupled to the first memory cell, the second memory cell, and the third memory cell,
wherein the first word line, the second word line, the third word line, and the first bit line are sequentially stacked above the semiconductor substrate.

4. The device of claim 1, further comprising:
a fourth memory cell; and
a fourth word line electrically coupled to the fourth memory cell,
wherein the control circuit
applies, when applying the first voltage to the first word line and the second voltage to the second word line, a fifth voltage to the fourth word line, and
applies, after applying the third voltage to the second word line and before applying the third voltage to the first word line, the third voltage to the fourth word line.

5. The device of claim 4, further comprising:
a semiconductor substrate; and
a first bit line electrically coupled to the first memory cell, the second memory cell, and the fourth memory cell, wherein the first word line, the fourth word line, the second word line, and the first bit line are sequentially stacked above the semiconductor substrate.

6. The device of claim 1, further comprising:
a first select transistor;
a second select transistor;
a first select gate line electrically coupled to a gate of the first select transistor; and
a second select gate line electrically coupled to a gate of the second select transistor,
wherein the control circuit
applies, when applying the first voltage to the first word line and the second voltage to the second word line, a sixth voltage to the first select gate line and the second select gate line, and
applies, after applying the third voltage to the first word line, the third voltage to the first select gate line and the second select gate line.

* * * * *